(12) United States Patent
Mukai et al.

(10) Patent No.: US 8,905,296 B2
(45) Date of Patent: Dec. 9, 2014

(54) WIRELESS INTEGRATED CIRCUIT DEVICE AND METHOD OF MANUFACTURING THE SAME

(71) Applicant: Murata Manufacturing Co., Ltd., Nagaokakyo-shi, Kyoto-fu (JP)

(72) Inventors: Tsuyoshi Mukai, Nagaokakyo (JP); Yuya Dokai, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 13/961,995

(22) Filed: Aug. 8, 2013

(65) Prior Publication Data

US 2013/0320098 A1   Dec. 5, 2013

Related U.S. Application Data

(63) Continuation of application No. PCT/JP2012/080700, filed on Nov. 28, 2012.

(30) Foreign Application Priority Data

Dec. 1, 2011 (JP) ................. 2011-263197

(51) Int. Cl.
*G06F 17/00* (2006.01)
*G06K 19/07* (2006.01)
*H01Q 9/16* (2006.01)
*G06K 19/077* (2006.01)
*H01L 21/52* (2006.01)

(52) U.S. Cl.
CPC ........ *G06K 19/0075* (2013.01); *G06K 19/0723* (2013.01); *H01Q 9/16* (2013.01); *G06K 19/07754* (2013.01); *H01L 21/52* (2013.01); *G06K 19/07786* (2013.01)
USPC ....................................... 235/375

(58) Field of Classification Search
CPC .................................................. G06K 17/0723
USPC .......................................... 235/492; 343/873
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |

(Continued)

FOREIGN PATENT DOCUMENTS

| | | |
|---|---|---|
| CA | 2 279 176 A1 | 7/1998 |
| CN | 101578616 A | 11/2009 |

(Continued)

OTHER PUBLICATIONS

Official Communication issued in International Application No. PCT/JP2007/066007, mailed on Nov. 27, 2007.

(Continued)

*Primary Examiner* — Thien M Le
*Assistant Examiner* — Toan Ly
(74) *Attorney, Agent, or Firm* — Keating & Bennett, LLP

(57) ABSTRACT

A wireless IC device includes a base material sheet having a long-side direction and a short-side direction, an antenna element provided on a surface of the base material sheet and that includes two radiation portions extending in the long side direction with a predetermined gap therebetween and two connection portions located in a gap through which the two radiation portions oppose each other, a wireless IC element connected to the two connection portions via a conductive bonding material, and a resist layer that covers the two radiation portions and does not cover the two connection portions and at least areas adjacent to the connection portions in the short-side direction.

18 Claims, 29 Drawing Sheets

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0186004 A1 | 12/2002 | Prazeres da Costa et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2003/0206095 A1 | 11/2003 | Chaloner et al. |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0007296 A1 | 1/2005 | Endo et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0162331 A1 | 7/2005 | Endo et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2006/0267200 A1* | 11/2006 | Mickle et al. ............ 257/754 |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0122960 A1 | 5/2007 | Aoki |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0074268 A1 | 3/2008 | Shafer |
| 2008/0087990 A1 | 4/2008 | Kato et al. |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0252551 A1 | 10/2008 | Kubo et al. |
| 2008/0272885 A1 | 11/2008 | Atherton |
| 2009/0002130 A1 | 1/2009 | Kato |
| 2009/0008460 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0093595 A1* | 4/2009 | Kimura et al. ............ 525/450 |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0134979 A1 | 5/2009 | Tsukamoto et al. |
| 2009/0140947 A1 | 6/2009 | Sasagawa et al. |
| 2009/0160719 A1 | 6/2009 | Kato et al. |
| 2009/0201116 A1 | 8/2009 | Orihara |
| 2009/0224061 A1 | 9/2009 | Kato et al. |

(56) References Cited

U.S. PATENT DOCUMENTS

| | | |
|---|---|---|
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0080331 A1 | 4/2011 | Kato |
| 2011/0186641 A1 | 8/2011 | Kato et al. |
| 2011/0253795 A1 | 10/2011 | Kato |
| 2012/0001701 A1 | 1/2012 | Taniguchi et al. |

FOREIGN PATENT DOCUMENTS

| | | | |
|---|---|---|---|
| DE | 10 2006 057 369 A1 | 6/2008 | |
| EP | 0 694 874 A2 | 1/1996 | |
| EP | 0 848 448 A2 | 6/1998 | |
| EP | 0 948 083 A2 | 10/1999 | |
| EP | 0 977 145 A2 | 2/2000 | |
| EP | 1 010 543 A1 | 6/2000 | |
| EP | 1 085 480 A1 | 3/2001 | |
| EP | 1 160 915 A2 | 12/2001 | |
| EP | 1 170 795 A2 | 1/2002 | |
| EP | 1 193 793 A2 | 4/2002 | |
| EP | 1 227 540 A1 | 7/2002 | |
| EP | 1 280 232 A1 | 1/2003 | |
| EP | 1 280 350 A1 | 1/2003 | |
| EP | 1 343 223 A1 | 9/2003 | |
| EP | 1 357 511 A2 | 10/2003 | |
| EP | 1 547 753 A1 | 6/2005 | |
| EP | 1 548 872 A1 | 6/2005 | |
| EP | 1 626 364 A2 | 2/2006 | |
| EP | 1 701 296 A1 | 9/2006 | |
| EP | 1 703 589 A1 | 9/2006 | |
| EP | 1 742 296 A1 | 1/2007 | |
| EP | 1 744 398 A1 | 1/2007 | |
| EP | 1 840 802 A1 | 10/2007 | |
| EP | 1 841 005 A1 | 10/2007 | |
| EP | 1 865 574 A1 | 12/2007 | |
| EP | 1 887 652 A1 | 2/2008 | |
| EP | 1 976 056 A1 | 10/2008 | |
| EP | 1 988 491 A1 | 11/2008 | |
| EP | 1 988 601 A1 | 11/2008 | |
| EP | 1 993 170 A1 | 11/2008 | |
| EP | 2 009 738 A1 | 12/2008 | |
| EP | 2 012 258 A1 | 1/2009 | |
| EP | 2 096 709 A1 | 9/2009 | |
| EP | 2 148 449 A1 | 1/2010 | |
| EP | 2 166 617 A1 | 3/2010 | |
| EP | 2 251 934 A1 | 11/2010 | |
| EP | 2 256 861 A1 | 12/2010 | |
| EP | 2 330 684 A1 | 6/2011 | |
| GB | 2 305 075 A | 3/1997 | |
| GB | 2461443 A | 1/2010 | |
| GB | 2470299 A | 11/2010 | |
| JP | 50-143451 A | 11/1975 | |
| JP | 61-284102 A | 12/1986 | |
| JP | 62-127140 U | 8/1987 | |
| JP | 01-212035 A | 8/1989 | |
| JP | 02-164105 A | 6/1990 | |
| JP | 02-256208 A | 10/1990 | |
| JP | 3-171385 A | 7/1991 | |
| JP | 03-503467 A | 8/1991 | |
| JP | 03-262313 A | 11/1991 | |
| JP | 04-150011 A | 5/1992 | |
| JP | 04-167500 A | 6/1992 | |
| JP | 04-096814 U | 8/1992 | |
| JP | 04-101168 U | 9/1992 | |
| JP | 04-134807 U | 12/1992 | |
| JP | 05-226926 A | 9/1993 | |
| JP | 05-327331 A | 12/1993 | |
| JP | 6-53733 A | 2/1994 | |
| JP | 06-077729 A | 3/1994 | |
| JP | 06-029215 U | 4/1994 | |
| JP | 06-177635 A | 6/1994 | |
| JP | 6-260949 A | 9/1994 | |
| JP | 07-183836 A | 7/1995 | |
| JP | 08-055725 A | 2/1996 | |
| JP | 08-056113 A | 2/1996 | |
| JP | 8-87580 A | 4/1996 | |
| JP | 08-88586 A | 4/1996 | |
| JP | 08-088586 A | 4/1996 | |
| JP | 08-176421 A | 7/1996 | |
| JP | 08-180160 A | 7/1996 | |
| JP | 08-279027 A | 10/1996 | |
| JP | 08-307126 A | 11/1996 | |
| JP | 08-330372 A | 12/1996 | |
| JP | 09-014150 A | 1/1997 | |
| JP | 09-035025 A | 2/1997 | |
| JP | 9-93029 A | 4/1997 | |
| JP | 09-093029 A | 4/1997 | |
| JP | 09-245381 A | 9/1997 | |
| JP | 09-252217 A | 9/1997 | |
| JP | 09-270623 A | 10/1997 | |
| JP | 09-284038 A | 10/1997 | |
| JP | 09-294374 A | 11/1997 | |
| JP | 9-512367 A | 12/1997 | |
| JP | 10-069533 A | 3/1998 | |
| JP | 10-69533 A | 3/1998 | |
| JP | 10-084406 A | 3/1998 | |
| JP | 10-505466 A | 5/1998 | |
| JP | 10-171954 A | 6/1998 | |
| JP | 10-173427 A | 6/1998 | |
| JP | 10-193849 A | 7/1998 | |
| JP | 10-193851 A | 7/1998 | |
| JP | 10-242742 A | 9/1998 | |
| JP | 10-293828 A | 11/1998 | |
| JP | 10-334203 A | 12/1998 | |
| JP | 2834584 B2 | 12/1998 | |
| JP | 11-025244 A | 1/1999 | |
| JP | 11-039441 A | 2/1999 | |
| JP | 11-075329 A | 3/1999 | |
| JP | 11-085937 A | 3/1999 | |
| JP | 11-88241 A | 3/1999 | |
| JP | 11-102424 A | 4/1999 | |
| JP | 11-103209 A | 4/1999 | |
| JP | 11-149536 A | 6/1999 | |
| JP | 11-149537 A | 6/1999 | |
| JP | 11-149538 A | 6/1999 | |
| JP | 11-175678 A | 7/1999 | |
| JP | 11177225 A * | 7/1999 | ............... H05K 3/34 |
| JP | 11-219420 A | 8/1999 | |
| JP | 11-220319 A | 8/1999 | |
| JP | 11-282993 A | 10/1999 | |
| JP | 11-328352 A | 11/1999 | |
| JP | 11-331014 A | 11/1999 | |
| JP | 11-346114 A | 12/1999 | |
| JP | 11-515094 A | 12/1999 | |
| JP | 2000-21128 A | 1/2000 | |
| JP | 2000-021639 A | 1/2000 | |
| JP | 2000-022421 A | 1/2000 | |
| JP | 2000-048152 A | 2/2000 | |
| JP | 2000-059260 A | 2/2000 | |
| JP | 2000-085283 A | 3/2000 | |
| JP | 2000-090207 A | 3/2000 | |
| JP | 2000-132643 A | 5/2000 | |
| JP | 2000-137778 A | 5/2000 | |
| JP | 2000-137779 A | 5/2000 | |
| JP | 2000-137785 A | 5/2000 | |
| JP | 2000-148948 A | 5/2000 | |
| JP | 2000-172812 A | 6/2000 | |
| JP | 2000-209013 A | 7/2000 | |
| JP | 2000-222540 A | 8/2000 | |
| JP | 2000-510271 A | 8/2000 | |
| JP | 2000-242754 A | 9/2000 | |
| JP | 2000-243797 A | 9/2000 | |
| JP | 2000-251049 A | 9/2000 | |
| JP | 2000-261230 A | 9/2000 | |

(56) References Cited

FOREIGN PATENT DOCUMENTS

| | | |
|---|---|---|
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-245416 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-324221 A | 11/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-108966 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166175 A | 6/2004 |
| JP | 2004-166176 A | 6/2004 |
| JP | 2004-172919 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |

(56) References Cited

FOREIGN PATENT DOCUMENTS

| | | |
|---|---|---|
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-336604 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-013120 A | 1/2007 |
| JP | 2007-18067 A | 1/2007 |
| JP | 2007-019905 A | 1/2007 |
| JP | 2007-028002 A | 2/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-068073 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-194924 A | 8/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042379 A | 2/2008 |
| JP | 2008-042910 A | 2/2008 |
| JP | 2008-72243 A | 3/2008 |

(56) References Cited

FOREIGN PATENT DOCUMENTS

| | | |
|---|---|---|
| JP | 2008-083867 A | 4/2008 |
| JP | 2008-092131 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-244739 A | 10/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111950 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-278441 A | 11/2009 |
| JP | 2009-284182 A | 12/2009 |
| JP | 2010-009196 A | 1/2010 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-074839 A | 4/2010 |
| JP | 2010-081571 | 4/2010 |
| JP | 2010-102445 A | 5/2010 |
| JP | 2010-171857 A | 8/2010 |
| JP | 4535209 B2 | 9/2010 |
| JP | 4561932 B2 | 10/2010 |
| JP | 2010-268306 A | 11/2010 |
| JP | 2010-279029 A | 12/2010 |
| JP | 2011-015395 A | 1/2011 |
| JP | 4609604 B2 | 1/2011 |
| JP | 2011-076567 A | 4/2011 |
| JP | 2011-139533 A | 7/2011 |
| JP | 2011-142648 A | 7/2011 |
| JP | 2011-205384 A | 10/2011 |
| JP | 2012-033021 A | 2/2012 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/060792 A1 | 5/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

OTHER PUBLICATIONS

Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.

(56) References Cited

OTHER PUBLICATIONS

Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2012/050557, mailed on Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Appl. No. 13/848,748, filed Mar. 22, 2013.
Official Communication issued in International Patent Application No. PCT/JP2012/080493, mailed on Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, mailed on Jan. 15, 2013.

Mukai et al.: "Wireless Integrated Circuit Device and Method of Manufacturing the Same"; U.S. Appl. No. 13/961,995, filed Aug. 8, 2013.
Kato et al.: "Radio IC Device"; U.S. Appl. No. 13/964,234, filed Aug. 12, 2013.
Official Communication issued in International Patent Application No. PCT/JP2012/067779, mailed on Aug. 28, 2012.
Official Communication issued in International Patent Application No. PCT/JP2013/051254, mailed on Apr. 2, 2013.
Dokai: "Wireless Communication Device"; U.S. Appl. No. 13/970,633, filed Aug. 20, 2013.
Official Communication issued in International Patent Application No. PCT/JP2012/059350, mailed on Jul. 3, 2012.
Dokai: "Wireless IC Device"; U.S. Appl. No. 14/011,823, filed Aug. 28, 2013.
Official Communication issued in International Patent Application No. PCT/JP2012/055505, mailed on Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2012/067454, mailed on Aug. 7, 2012.
Kato: "Antenna Device and Communication Terminal Apparatus"; U.S. Appl. No. 14/019,573, filed Sep. 6, 2013.
Official Communication issued in International Patent Application No. PCT/JP2012/067537, mailed on Oct. 9, 2012.
Kato: "Radio Communication Device"; U.S. Appl. No. 14/027,384, filed Sep. 16, 2013.
Kato: "Antenna Device, RFID Tag, and Communication Terminal Apparatus"; U.S. Appl. No. 14/031,270, filed Sep. 19, 2013.
Kato et al.: "Wireless IC Device"; U.S. Appl. No. 14/054,865, filed Oct. 16, 2013.
Official Communication issued in International Patent Application No. PCT/JP2012/062259, mailed on Jun. 12, 2012.
Dokai et al.: "Radio IC Device"; U.S. Appl. No. 14/078,596, filed Nov. 13, 2013.
Official Communication issued in International Patent Application No. PCT/JP2012/072849, mailed on Nov. 20, 2012.
Kimura et al.: "Wireless Communication Device"; U.S. Appl. No. 14/082,435, filed Nov. 18, 2013.
Kato: "Antenna Device and Wireless Device"; U.S. Appl. No. 14/085,830, filed Nov. 21, 2013.
Kato et al.: "Wireless IC Device Component and Wireless IC Device"; U.S. Appl. No. 14/151,852, filed Jan. 10, 2014.
Kato: "Wireless IC Device and Electromagnetic Coupling Module"; U.S. Appl. No. 14/160,597, filed Jan. 22, 2014.
Kato et al.: "Wireless IC Device"; U.S. Appl. No. 14/162,806, filed Jan. 24, 2014.
Kato et al.: "Antenna Device and Wireless Communication Device"; U.S. Appl. No. 14/171,004, filed Feb. 3, 2014.
Kato et al.: "Antenna and Wireless IC Device"; U.S. Appl. No. 14/182,339, filed Feb. 18, 2014.
Official Communication issued in International Patent Application No. PCT/JP2009/069486, mailed on Mar. 2, 2010.
Kato:"Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., LTD, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.

(56) References Cited

OTHER PUBLICATIONS

Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/057668, mailed on Aug. 17, 2010.
Dokai et al.: "Optical Disc"; U.S. Appl. No. 13/295,153, filed Nov. 14, 2011.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material with Electromagnetic Coupling Module,"; U.S. Appl. No. 12/536,663, filed Aug. 6, 2009.
Osamura et al.: "Packaging Material with Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.

(56) References Cited

OTHER PUBLICATIONS

Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: "Wireless IC Device and Manufacturing Method Thereof"; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.: "Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.

Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al.: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Modulate-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.

(56) References Cited

OTHER PUBLICATIONS

Official communication issued in counterpart International Application No. PCT/JP2008/062886, mailed Oct. 21, 2008.

Kato et al.: "Wireless IC Device," U.S. Appl. No. 12/469,896, filed May 21, 2009.

Ikemoto et al.: "Wireless IC Device," U.S. Appl. No. 12/496,709, filed Jul. 2, 2009.

Official communication issued in counterpart International Application No. PCT/JP2008/062947, mailed Aug. 19, 2008.

Official communication issued in counterpart International Application No. PCT/JP2008/055567, mailed May 20, 2008.

Ikemoto et al.: "Wireless IC Device and Electronics Apparatus," U.S. Appl. No. 12/503,188, filed Jul. 15, 2009.

Official communication issued in counterpart International Application No. PCT/JP2008/051853, mailed Apr. 22, 2008.

Official communication issued in counterpart International Application No. PCT/JP2008/057239, mailed Jul. 22, 2008.

Kimura et al.: "Wireless IC Device," U.S. Appl. No. 12/510,338, filed Jul. 28, 2009.

Kato et al.: "Wireless IC Device," U.S. Appl. No. 12/510,340, filed Jul. 28, 2009.

Kato: "Wireless IC Device," U.S. Appl. No. 12/510,344, filed Jul. 28, 2009.

Kato et al.: "Wireless IC Device," U.S. Appl. No. 12/510,347, filed Jul. 28, 2009.

Official Communication issued in corresponding Chinese Patent Application No. 201280007592.9, mailed on Apr. 28, 2014.

\* cited by examiner

F I G . 8
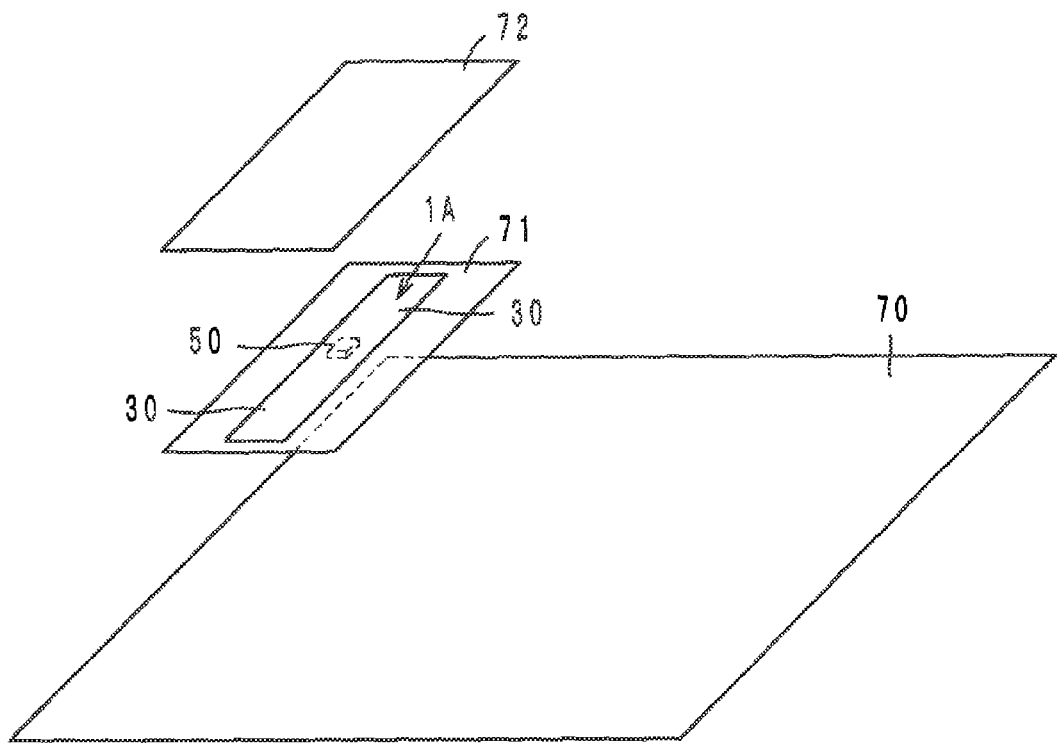

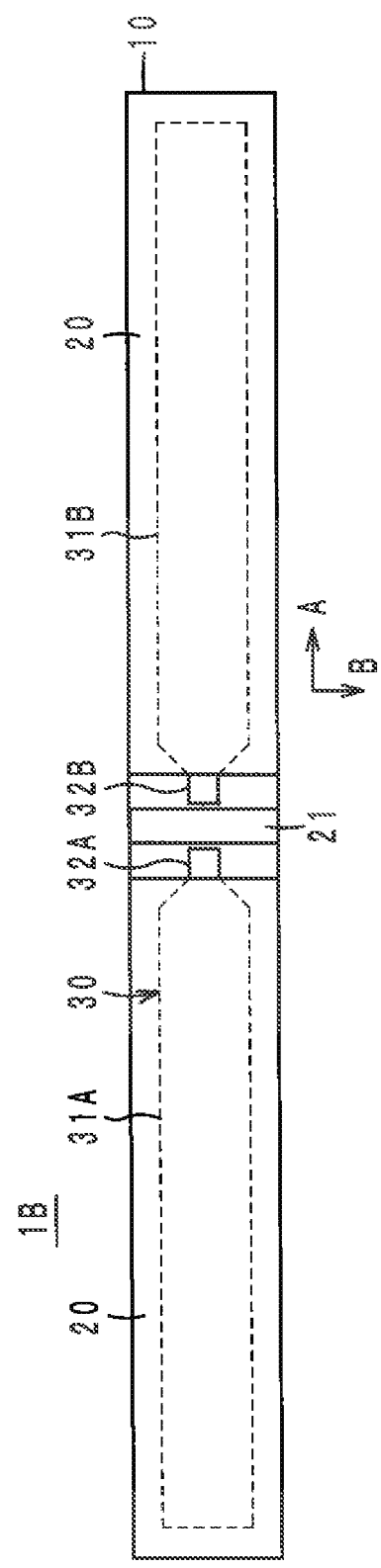

F I G . 1 2 E
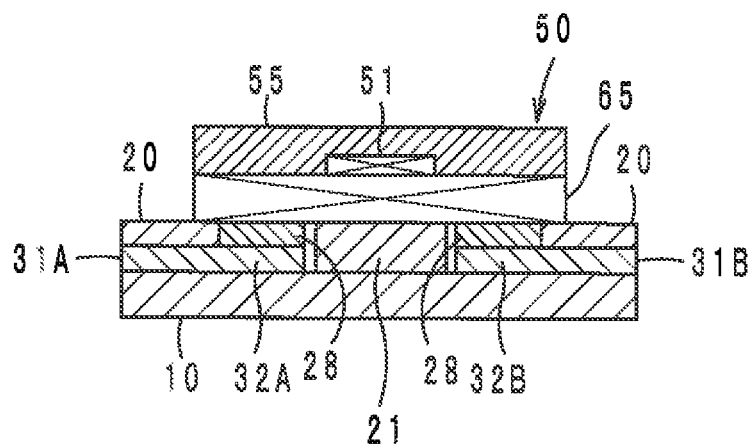
F I G . 1 2 F
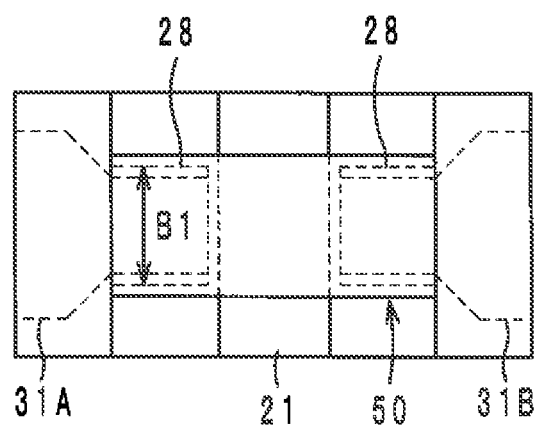

WIRELESS INTEGRATED CIRCUIT DEVICE AND METHOD OF MANUFACTURING THE SAME

This application claims priority to Japanese Patent Application No. 2011-263197 filed on Dec. 1, 2011 and International Patent Application No. PCT/JP2012/080700 filed on Nov. 28, 2012, the entire disclosures of which are incorporated herein by reference.

BACKGROUND OF THE INVENTION

1. Field of the Invention

The present invention relates to wireless integrated circuit (IC) devices, and more particularly to a wireless IC device used in a radio frequency identification (RFID) system, and relates to a method of manufacturing the wireless IC device.

2. Description of the Related Art

In recent years, as a system for managing item information, a radio frequency identification (RFID) system in which a reader-writer that generates an induction field and a radio frequency identification (RFID) tag (also referred to as a wireless integrated circuit (IC) device) that is attached to an item, communicate with each other in a non-contact manner using an electromagnetic field and transmit predetermined information to each other has been put to practical use. Such an RFID tag stores predetermined information and includes a wireless integrated circuit (IC) chip that processes a predetermined radio signal and an antenna (a radiator) that performs sending/receiving of a high-frequency signal. Such RFID tags are used by being attached to various items to be managed (or packaging materials of the items to be managed).

As the RFID system, a high frequency (HF) band RFID system using a bandwidth of 13 MHz and an ultra-high frequency (UHF) band RFID system using a bandwidth of 900 MHz are common. In particular, the UHF band RFID system has a relatively long communication range and can collectively read a plurality of tags, and thus, the UHF band RFID system has been considered promising as an item management system.

In recent years, the RFID system has been applied in the medical field. For example, in Japanese Unexamined Patent Application Publication Nos. 2002-355258, 2004-121412, and 2011-015395, attaching a tag for a UHF band to a piece of surgical gauze has been proposed in order to prevent an accident such as leaving such a piece of gauze in the body of a patient by attaching a tag for a UHF band to such a piece of gauze and detecting the tag using a reader-writer.

In the medical field, an RFID tag that is attached to a piece of surgical gauze is often used in a liquid or in a high-humidity environment. In such environments, in the case where an antenna is exposed on a surface of an RFID tag, problems occur in that the antenna becomes corroded, and that structural components of the antenna are dissolved in the liquid. Therefore, in order to enhance environmental resistance characteristics of the antenna, the antenna needs to be coated with a resist material (a coverlay).

In other words, as illustrated in FIG. 16A, it may be considered that a resist layer 220 is provided on a pair of radiation portions 231A and 231B provided on a rectangular base material sheet 210 and extending in a long-side direction A from a center portion of the base material sheet 210, openings at which connection portions 232A and 232B of the radiation portions 231A and 231B (see FIGS. 16A to 16C, FIG. 17A, and FIG. 17B) are exposed are formed in the resist layer 220, the openings are filled with solder 228 (see FIG. 17C, and FIG. 17D), and a wireless integrated circuit (IC) element 250 is electrically connected to the solder 228. However, when the solder 228 is caused to melt due to reflow soldering used to make the electrical connection, the solder 228 is pressed by the wireless IC element 250, and the solder 228 in a molten state comes into contact with the resist layer 220. In this case, when an excessive amount of the solder 228 has been supplied, as illustrated in FIG. 17E and FIG. 17F, the solder 228 overflows the periphery of the wireless IC element 250, and ball-shaped solder grains 228a may sometimes be formed. In the case where printing misalignment occurs when the resist layer 220 is formed (printed), positions of the connection portions 232A and 232B are displaced. When such a problem occurs, electrical characteristics of the wireless IC element 250 vary resulting in, for example, mismatching of characteristic impedance.

SUMMARY OF THE INVENTION

Accordingly, preferred embodiments of the present invention provide a wireless integrated circuit (IC) device and a method of manufacturing the wireless IC device that prevents variations in electrical characteristics of a wireless integrated circuit (IC) element with respect to being connected to an antenna element.

A wireless IC device according to a first preferred embodiment of the present invention includes a base material sheet that has a rectangular or substantially rectangular shape having a long-side direction and a short-side direction, an antenna element that is provided on a surface of the base material sheet and that includes two radiation portions extending in the long side direction with a predetermined gap therebetween and two connection portions located in a gap through which the two radiation portions oppose each other, a wireless IC element that is connected to the two connection portions via a conductive bonding material, and a resist layer that covers the two radiation portions and does not cover the two connection portions and at least areas adjacent to the connection portions in the short-side direction.

A method of manufacturing a wireless IC device according to a second preferred embodiment of the present invention includes preparing a base material sheet that has a rectangular or substantially rectangular shape having a long-side direction and a short-side direction, forming on a surface of the base material sheet an antenna element that includes two radiation portions extending in the long side direction with a predetermined gap therebetween and two connection portions formed in the gap through which the two radiation portions oppose each other, arranging a resist layer such that the resist layer covers the two radiation portions and does not cover the two connection portions and at least areas adjacent to the connection portions in the short-side direction, disposing a conductive bonding material on the two connection portions, and connecting a wireless IC element to the conductive bonding material.

The wireless IC device is preferably attached to, for example, a piece of medical gauze and communicates with a reader-writer of a radio frequency identification (RFID) system, so that the whereabouts of the piece of medical gauze is known. As a result, an accident such as leaving a piece of gauze in the body of a patient is prevented from occurring. Since the radiation portions that function as antennas are covered with the resist layer, the environmental resistance characteristics of the radiation portions are improved. In addition, in the wireless IC device, the resist layer does not cover the two connection portions and at least the areas adjacent to the connection portions in the short-side direction, and thus, even if the conductive bonding material that bonds the connection portions and the wireless IC element together melts and expands, the conductive bonding material at least flows along the connection portions in the short-side direction, and thus, the conductive bonding material having a ball shape will not be formed in the periphery of the wireless IC element. Even if the resist layer is formed so as to be displaced in the short-side direction, the positions of the connection portions do not change. Therefore, variations in the electrical characteristics such as characteristic impedance are not likely to occur in the wireless IC element.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is an exploded perspective view illustrating a structure in which the wireless IC device is attached to a piece of gauze.

FIG. 10A is a plan view of a wireless IC device according to a second preferred embodiment in a state before a wireless IC element is mounted on the wireless IC device.

FIG. 12E is a third sectional view of the principal portion of the wireless IC device according to the second preferred embodiment of the present invention in the process of being manufactured.

FIG. 12F is a third plan view of the principal portion of the wireless IC device illustrated in FIG. 12E.

DETAILED DESCRIPTION OF THE PREFERRED EMBODIMENTS

Figure 1A:
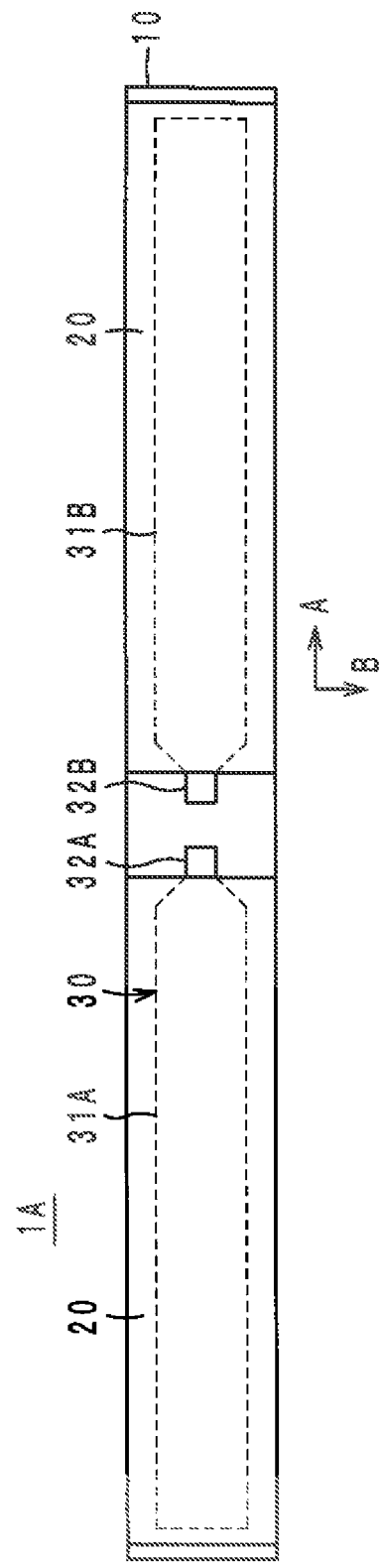
FIG. 1A is a plan view of a wireless integrated circuit (IC) device according to a first preferred embodiment in a state before a wireless integrated circuit (IC) element is mounted on the wireless IC device.

Preferred embodiments of a wireless integrated circuit (IC) device and a method of manufacturing the wireless IC device according to the present invention will be described below with reference to the accompanying drawings. Note that, in the drawings, the same components and portions are denoted by the same reference numerals, and repeated descriptions thereof will be omitted.

First Preferred Embodiment

Figure 1B:
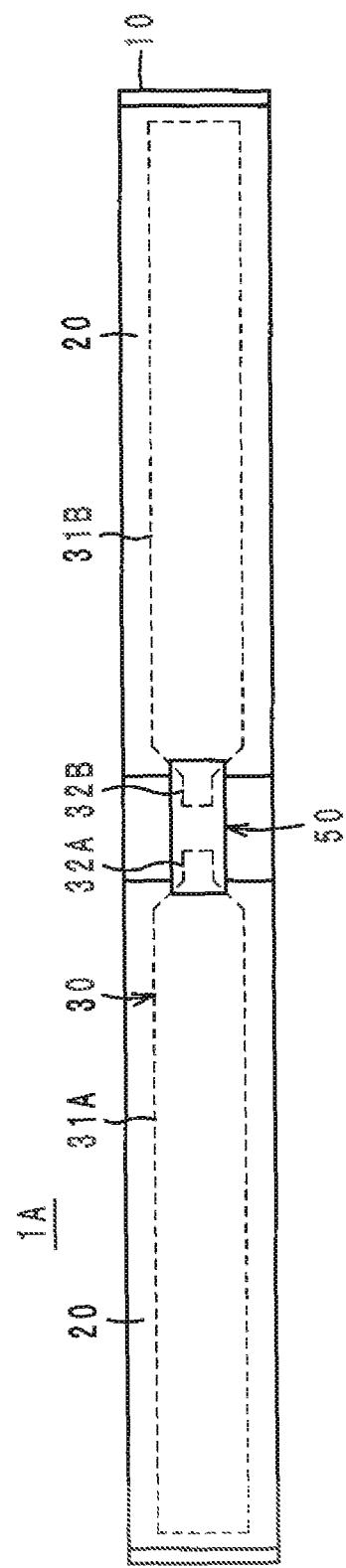
FIG. 1B is a plan view of the wireless IC device according to the first preferred embodiment with the wireless IC element mounted on the wireless IC device.
Figure 1C:
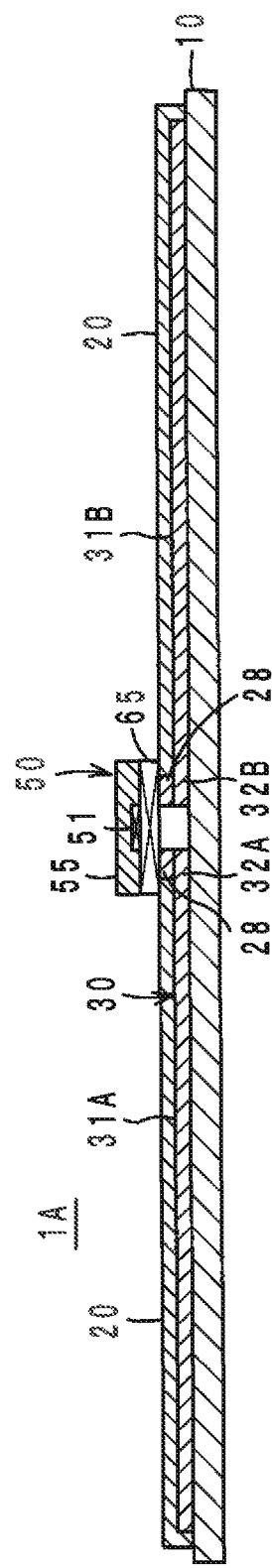
FIG. 1C is a sectional view of the wireless IC device illustrated in FIG. 1B in a long-side direction.

A wireless IC device 1A according to a first preferred embodiment is preferably used in ultra-high frequency (UHF) band communication, for example. As illustrated in FIGS. 1A to 1C, the wireless IC device 1A includes a rectangular or substantially rectangular base material sheet 10 having flexibility, an antenna element 30 provided on a surface of the base material sheet 10 (including two radiation portions 31A and 31B and two connection portions 32A and 32B) and, a wireless integrated circuit (IC) element 50 that is connected to the antenna element 30, and a resist layer 20 that protects the antenna element 30. The wireless IC device 1A is configured as a so-called radio frequency identification (RFID) tag.

It is preferable that the base material sheet 10 have, for example, heat resistance and chemical resistance, and a thermoplastic resin material such as a polyimide or polyethylene terephthalate (PET) can be suitably used. On the base material sheet 10, the antenna element 30 preferably includes a metal film that contains silver, copper, aluminum, or the like as a main component and that is arranged over substantially the entire surface of the base material sheet 10 so as to have flexibility. The antenna element 30 is divided at a center portion thereof in a long-side direction A into the two radiation portions 31A and 31B with a gap therebetween, and the connection portions 32A and 32B (connection lands) are located in the gap across which the radiation portions 31A and 31B oppose each other. The wireless IC element 50 is bonded to the connection portions 32A and 32B with solder 28 so as to extend across the gap. In other words, the antenna element 30 defines and functions as a dipole radiating element. The length of each of the radiation portions 31A and 31B in a short-side direction B is larger than the length of a corresponding one of the connection portions 32A and 32B in the short-side direction B.

The wireless IC element 50 processes a radio frequency (RF) signal, and the details will be described later with reference to FIGS. 2 to 5. Coupling of the wireless IC element and end portions of the antenna element 30, namely, the connection portions 32A and 32B which are power supplying portions, is electrical direct coupling (DC connection) using a conductive bonding material such as the solder 28. More specifically, the wireless IC element 50 has a configuration in which a wireless integrated circuit (IC) chip 51 is mounted on a power supply circuit board 65, and in which the wireless IC chip 51 is sealed with a resin material 55. However, the power supply circuit board 65 is not essential, and the wireless IC chip 51 may be independently (directly) bonded to the antenna element 30.

The resist layer 20 is preferably made of, for example, a polyimide resin and formed by screen printing, stacking of sheet members on top of one another, or the like, so as to cover the radiation portions 31A and 31B and not to cover the connection portions 32A and 32B and at least areas adjacent to the connection portions 32A and 32B in the short-side direction B. In the first preferred embodiment, a portion of the resist layer 20 that does not cover the connection portions 32A and 32B is a non-formed portion of the resist layer 20.

Here, a communication operation of the wireless IC device 1A will be schematically described. When a predetermined high-frequency signal is transmitted from the wireless IC element 50 to the antenna element 30 via the connection portions 32A and 32B, the predetermined high-frequency signal is radiated from the antenna element 30 to the outside. Similarly, when the antenna element 30 receives a high frequency from the outside, power is supplied from the connection portions 32A and 32B to the wireless IC element 50. As a result, the wireless IC element 50 and a reader-writer (not illustrated) communicate with each other.

The wireless IC element 50 will be described below. The wireless IC element 50 may be, as illustrated in FIG. 2, the wireless IC chip 51 that processes a high-frequency signal or may include, as illustrated in FIG. 3, the wireless IC chip 51 and the power supply circuit board 65 that includes a resonance circuit having a predetermined resonant frequency.

Figure 2:
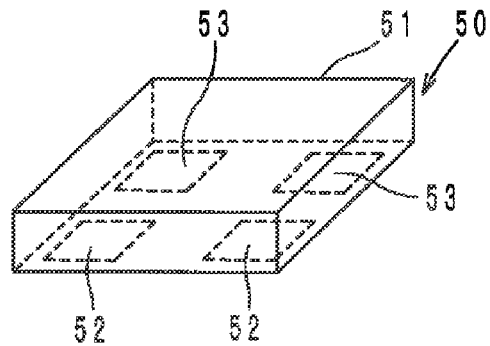
FIG. 2 is a perspective view of a wireless integrated circuit (IC) chip as the wireless IC element.

The wireless IC chip 51 illustrated in FIG. 2 is configured as a silicon semiconductor integrated circuit chip and includes a clock circuit, a logic circuit, a memory circuit, and the like. Necessary information is stored in the wireless IC chip 51. Input/output terminal electrodes 52 and 52 and mounting terminal electrodes 53 and 53 are disposed on a bottom surface of the wireless IC chip 51. The input/output terminal electrodes 52 and 52 are electrically connected to the connection portions 32A and 32B of the antenna element 30 through metal bumps or the like. Note that Au, solder, or the like may preferably be used as the material used to form the metal bumps are made, for example.

Figure 3:
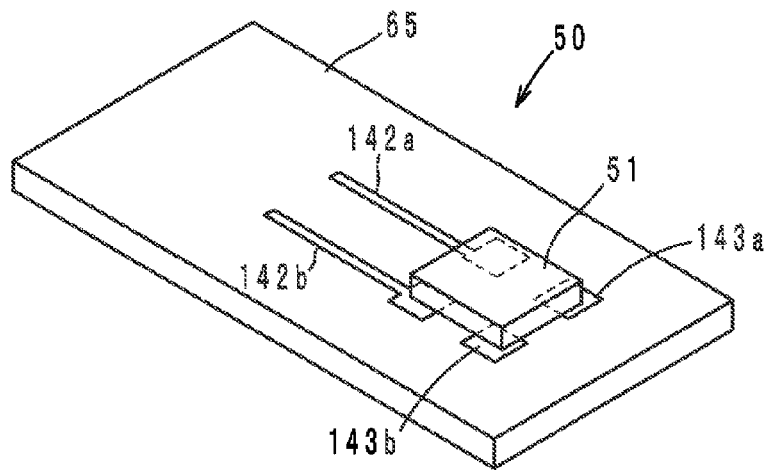
FIG. 3 is a perspective view illustrating a state where the wireless IC chip is mounted on a power supply circuit board as the wireless IC element.
Figure 4:
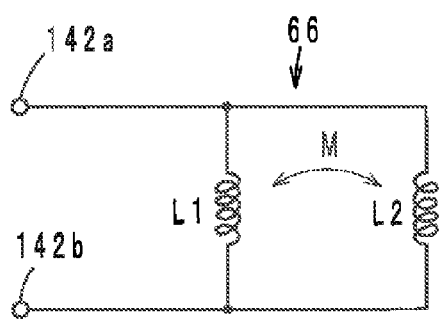
FIG. 4 is an equivalent circuit diagram illustrating an example of a power supply circuit.

In the case where the wireless IC element 50 includes the wireless IC chip 51 and the power supply circuit board 65 as illustrated in FIG. 3, various power supply circuits (including a resonance circuit and a matching circuit) can be provided on the power supply circuit board 65. An example of the various power supply circuits may be a power supply circuit 66 that is illustrated as an equivalent circuit in FIG. 4 and that includes inductance elements L1 and L2 that have inductance values different from each other and that are magnetically coupled in opposite phase (denoted by mutual inductance M). The power supply circuit 66 has a predetermined resonant frequency and performs impedance matching between the wireless IC chip 51 and the antenna element 30. Note that the wireless IC chip 51 and the power supply circuit 66 may be electrically connected (DC connection) to each other or may be coupled to each other via an electromagnetic field.

The power supply circuit 66 transmits a high-frequency signal having a predetermined frequency, which has been sent from the wireless IC chip 51, to the antenna element 30 and supplies a high-frequency signal that has been received to the wireless IC chip 51 via the antenna element 30. Since the power supply circuit 66 has a predetermined resonant frequency, impedance matching can be facilitated, and the electrical length of a portion of the antenna element 30 corresponding to the matching circuit can be reduced.

The configuration of the power supply circuit board 65 will now be described. As illustrated in FIG. 2 and FIG. 3, the input/output terminal electrodes 52 and 52 of the wireless IC chip 51, respectively, are connected to power supply terminal electrodes 142a and 142b that are provided on the power supply circuit board 65 via metal bumps or the like, and the mounting terminal electrodes 53 and 53, respectively, are connected to mount terminal electrodes 143a and 143b via metal bumps or the like.

Figure 5:
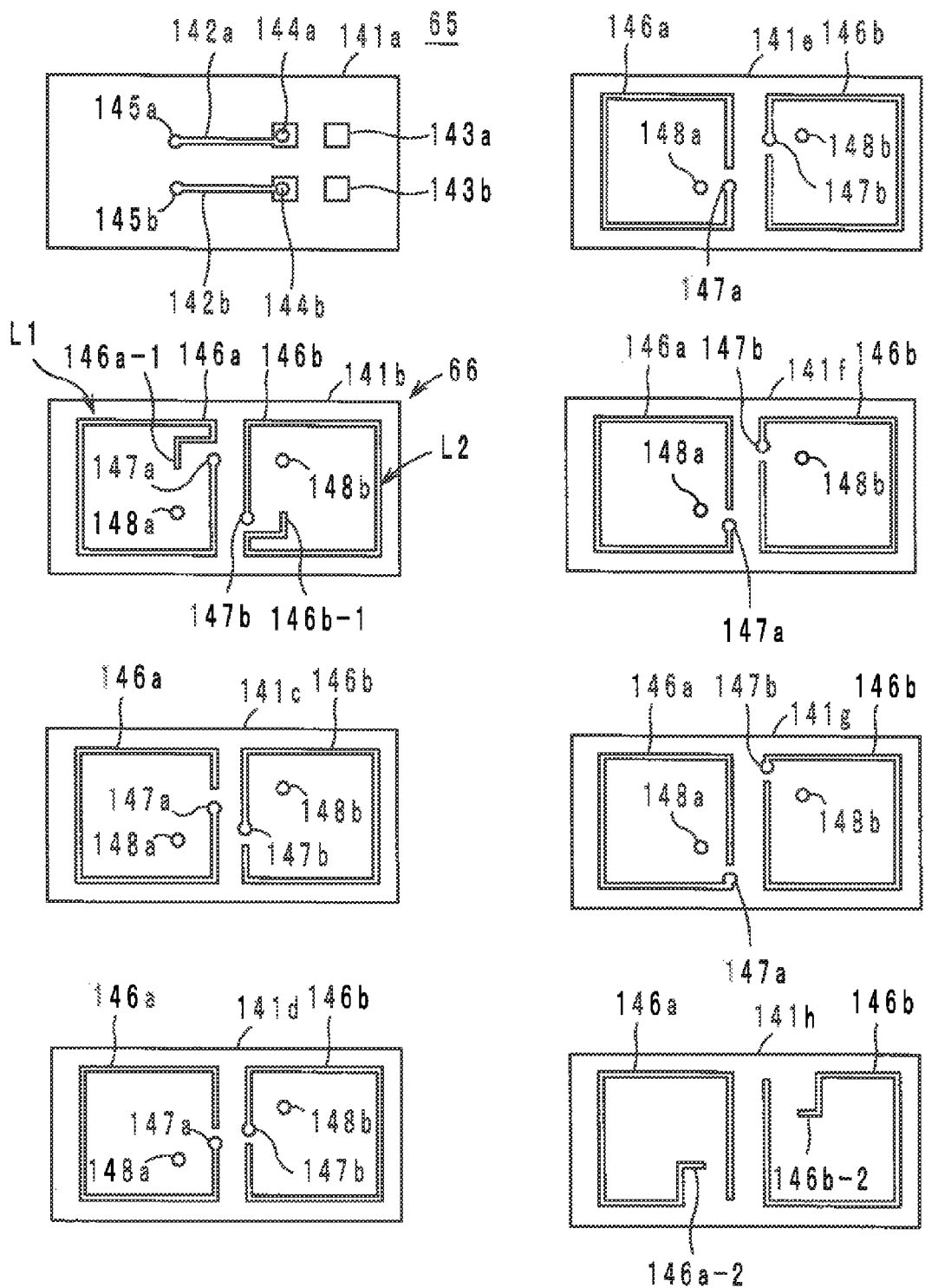
FIG. 5 is a plan view illustrating a multilayer structure of the power supply circuit board.
Figure 6:
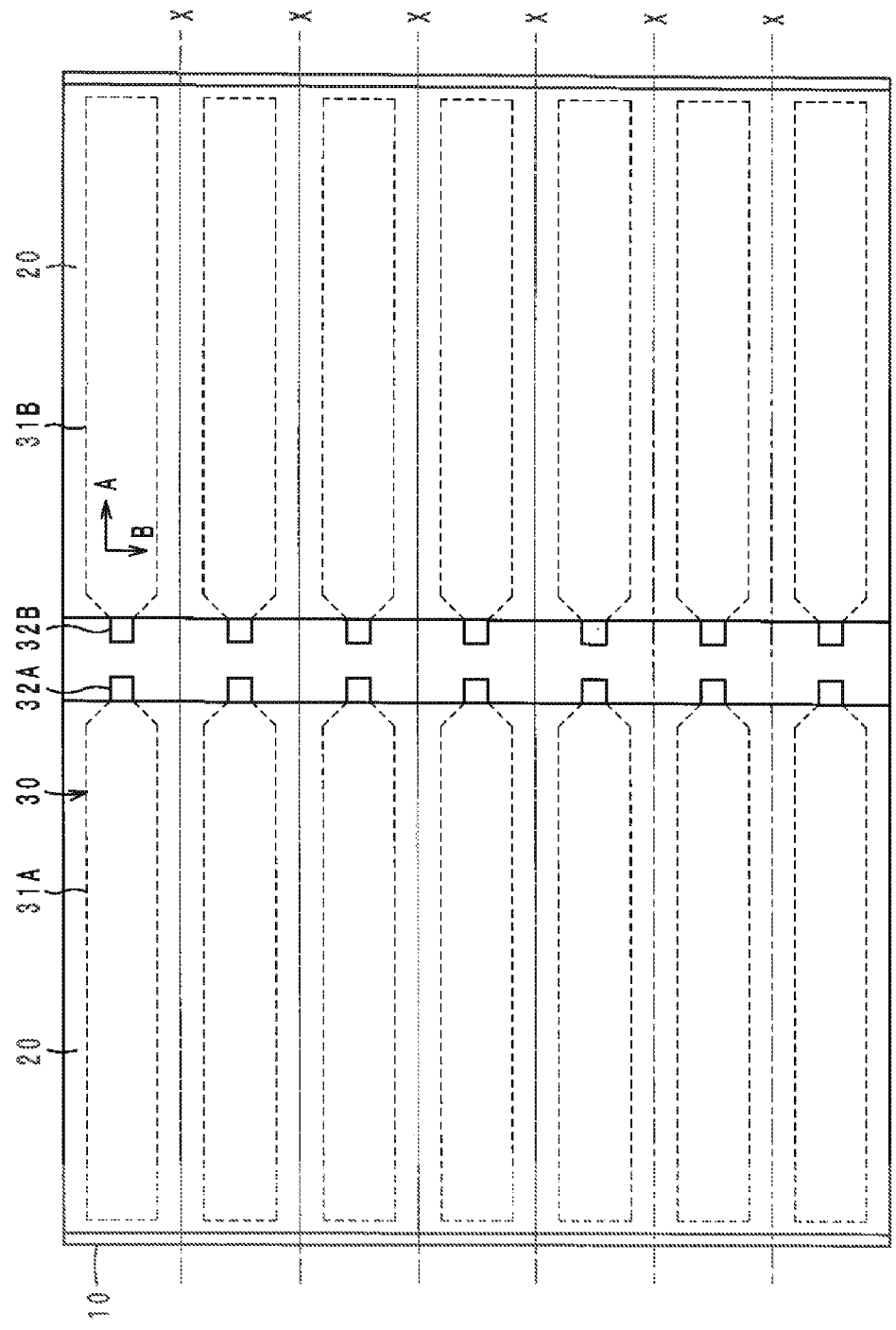
FIG. 6 is a plan view illustrating a state in the middle of a process of manufacturing the wireless IC device according to the first preferred embodiment of the present invention.

As illustrated in FIG. 5, the power supply circuit board 65 is preferably formed by stacking ceramic sheets 141a to 141h, each of which is made of a dielectric material or a magnetic material, on top of one another, pressing and fixing the ceramic sheets 141a to 141h in place, and firing the ceramic sheets 141a to 141h. However, an insulating layer that is included in the power supply circuit board 65 is not limited to a ceramic sheet and may be a resin sheet made of, for example, a thermosetting resin such as a liquid crystal polymer or a thermoplastic resin. The power supply terminal electrodes 142a and 142b, the mount terminal electrodes 143a and 143b, via hole conductors 144a, 144b, 145a, and 145b are formed on the sheet 141a that is the uppermost layer. The via hole conductors 144a and 145a are connected to each other by the power supply terminal electrode 142a. The via hole conductors 144b and 145b are connected to each other by the power supply terminal electrode 142b. Wiring electrodes 146a and 146b that are included in the inductance elements L1 and L2 are formed on each of the sheets 141b to 141h that are the second to eighth layers, and via hole conductors 147a, 147b, 148a, and 148b are formed on each of the sheets 141b to 141h as may be necessary.

By stacking the above-described sheets 141a to 141h on top of one another, the inductance element L1 in which the wiring electrodes 146a are helically connected at the via hole conductors 147a and the inductance element L2 in which the wiring electrodes 146b are helically connected at the via hole conductors 147b are formed. A capacitance is generated in a space between the wiring electrodes 146a and 146b.

An end portion 146a-1 of the wiring electrode 146a on the sheet 141b is connected to the power supply terminal electrode 142a via the via hole conductor 145a, and an end portion 146a-2 of the wiring electrode 146a on the sheet 141h is connected to the power supply terminal electrode 142b via the via hole conductors 148a and 145b. An end portion 146b-1 of the wiring electrode 146b on the sheet 141b is connected to the power supply terminal electrode 142b via the via hole conductor 144b, and an end portion 146b-2 of the wiring electrode 146b on the sheet 141h is connected to the power supply terminal electrode 142a via the via hole conductors 148b and 144a.

In the power supply circuit 66, which has been described above, the inductance elements L1 and L2 are wound in opposite directions, and current in the inductance element L1 and current in the inductance element L2 flow in opposite directions by differential signaling. Thus, magnetic fields that are generated in the inductance elements L1 and L2 cancel each other out. Since the magnetic fields cancel each other out, the wiring electrodes 146a and 146b need to have a certain length in order to obtain a desired inductance value. As a result, the Q value of the power supply circuit 66 becomes small, and thus, the sharpness of resonance characteristics is reduced. The bandwidth of the power supply circuit 66 becomes larger in the vicinity of the resonant frequency.

When the power supply circuit board 65 is seen in perspective plan view, the inductance elements L1 and L2 are located at different positions, one of which is to the right of the power supply circuit board 65 and the other of which is to the left of the power supply circuit board 65. In addition, the directions of the magnetic fields that are generated in the inductance elements L1 and L2 are opposite to each other. As a result, when the power supply circuit 66 (the inductance elements L1 and L2) is coupled to the antenna element 30, currents in opposite directions are excited in the antenna element 30, and the antenna element 30 is operated by the potential difference between the currents.

Occurrence of variations in characteristics due to the influence of an external item can be significantly reduced or prevented by providing a resonance/matching circuit in the power supply circuit board 65, and as a result, deterioration of communication quality can be prevented. In the case where the wireless IC chip 51 that is included in the wireless IC element is disposed toward the center of the power supply circuit board 65 in the thickness direction of the power supply circuit board 65, the wireless IC chip 51 can be prevented from breaking, and the mechanical strength of the wireless IC element 50 can be improved.

A non-limiting example of a method of manufacturing the wireless IC device 1A will now be described with reference to FIG. 6 and FIGS. 7A to 7F. In this manufacturing method, a technique of fabricating a plurality of wireless IC devices 1A as an aggregate substrate and after that cutting the aggregate substrate into units of the wireless IC devices 1A, or specifically a multi-piece manufacturing technique is preferably used.

First, the rectangular or substantially rectangular base material sheet 10 having a large area is prepared, and, on the base material sheet 10, the antenna element 30 that is divided into two portions extending in the long-side direction A with a gap therebetween (the radiation portions 31A and 31B and the connection portions 32A and 32B) includes a metal film. For example, a metal film that is formed by evaporation is patterned into a predetermined shape by etching. Next, the resist layer 20 is arranged so as to cover the radiation portions 31A and 31B and such that a non-formed portion that does not cover the connection portions 32A and 32B is formed in the resist layer 20. The resist layer 20 is formed by, for example, screen printing or performing transferring/thermal compression bonding of a sheet member to the base material sheet 10. In the case of screen printing, it is preferable that a squeegee be caused to move in the direction in which the non-formed portion extends (the short-side direction B). Next, a conductive bonding material (the solder 28) is disposed on the connection portions 32A and 32B, and the conductive bonding material is pressed by placing the wireless IC element 50 thereon. Then, the conductive bonding material and the wireless IC element 50 are connected to each other by reflow soldering. After that, the base material sheet is cut along cutting lines X illustrated in FIG. 6 into respective the wireless IC devices 1A.

Each of the wireless IC devices 1A is attached to, for example, a piece of surgical gauze and communicates with a reader-writer of a radio frequency identification (RFID) system, so that the whereabouts of the piece of surgical gauze is known. As a result, an accident such as leaving a piece of gauze in the body of a patient is prevented from occurring. In addition, since the radiation portions 31A and 31B that function as antennas are covered with the resist layer 20, environmental resistance characteristics of the radiation portions 31A and 31B are improved. Furthermore, in each of the wireless IC devices 1A, the resist layer 20 does not cover the two connection portions 32A and 32B and at least the areas adjacent to the connection portions 32A and 32B in the short-side direction B, and thus, even if the solder 28 that bonds the connection portions 32A and 32B and the wireless IC element 50 together melts and expands, the solder 28 flows along the connection portions 32A and 32B in the short-side direction B, and thus, solder having a ball shape will not be formed in the periphery of the wireless IC element 50. Even if the resist layer 20 is formed so as to be displaced in the short-side direction B, the positions of the connection portions 32A and 32B do not change. Therefore, occurrence of variations in the electrical characteristics such as characteristic impedance in the wireless IC element 50 is significantly reduced or prevented.

Figure 7A:
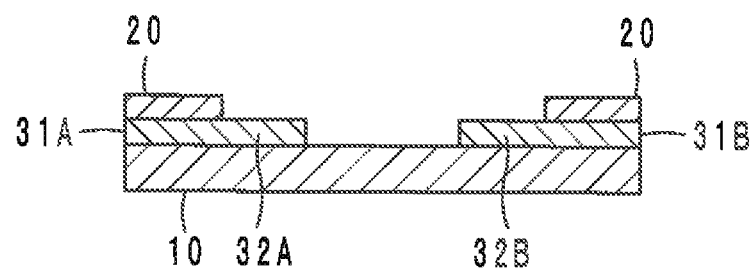
FIG. 7A is a first sectional view of a principal portion of the wireless IC device according to the first preferred embodiment of the present invention in the process of being manufactured.
Figure 7B:
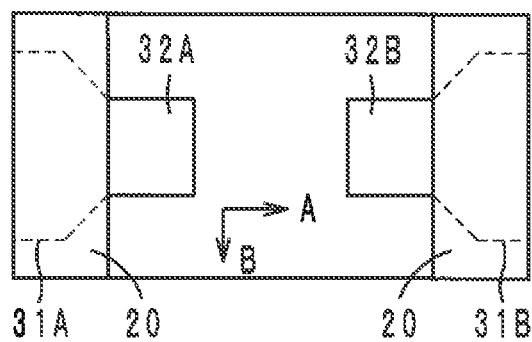
FIG. 7B is a first plan view of the principal portion of the wireless IC device illustrated in FIG. 7A.
Figure 7C:
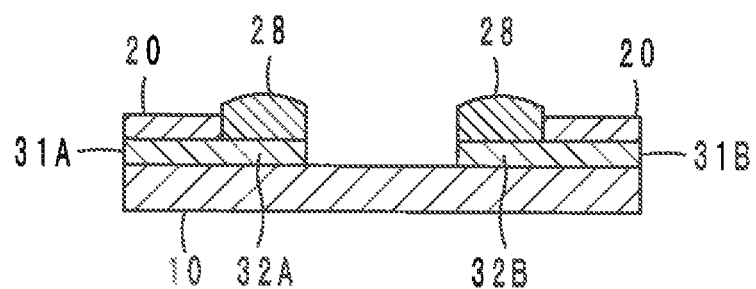
FIG. 7C is a second sectional view of the principal portion of the wireless IC device according to the first preferred embodiment of the present invention in the process of being manufactured.
Figure 7D:
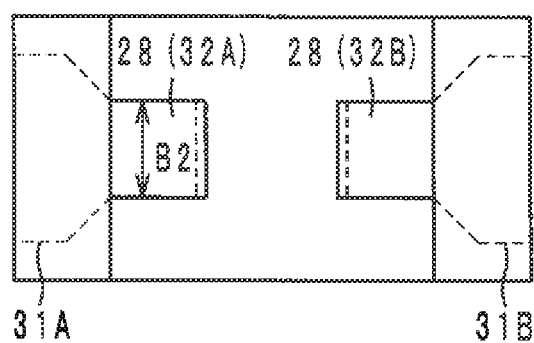
FIG. 7D is a second plan view of the principal portion of the wireless IC device illustrated in FIG. 7C.
Figure 7E:
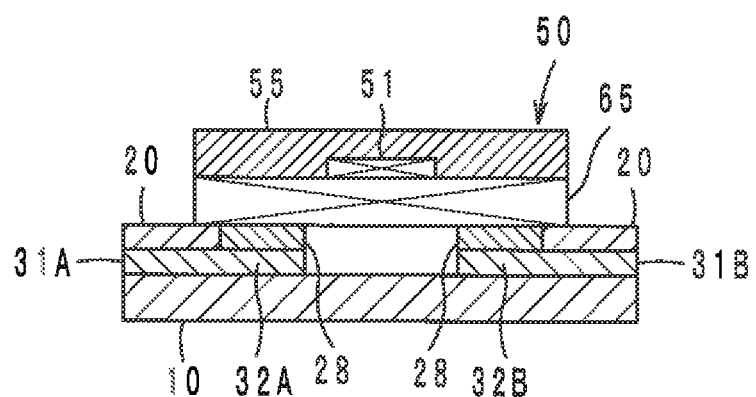
FIG. 7E is a third sectional view of the principal portion of the wireless IC device according to the first preferred embodiment of the present invention in the process of being manufactured.
Figure 7F:
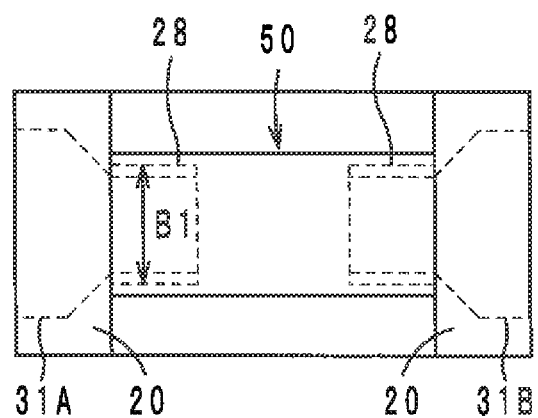
FIG. 7F is a third plan view of the principal portion of the wireless IC device illustrated in FIG. 7E.

In the manufacturing process that has been described above, the solder 28 flows along the connection portions 32A and 32B in the short-side direction B, and as a result, the maximum length B1 of the solder 28 in the short-side direction B that corresponds to the width dimension of the wireless IC element 50 (see FIG. 7F) is larger than the width B2 of each of the connection portions 32A and 32B (see FIG. 7D).

Figure 9A:
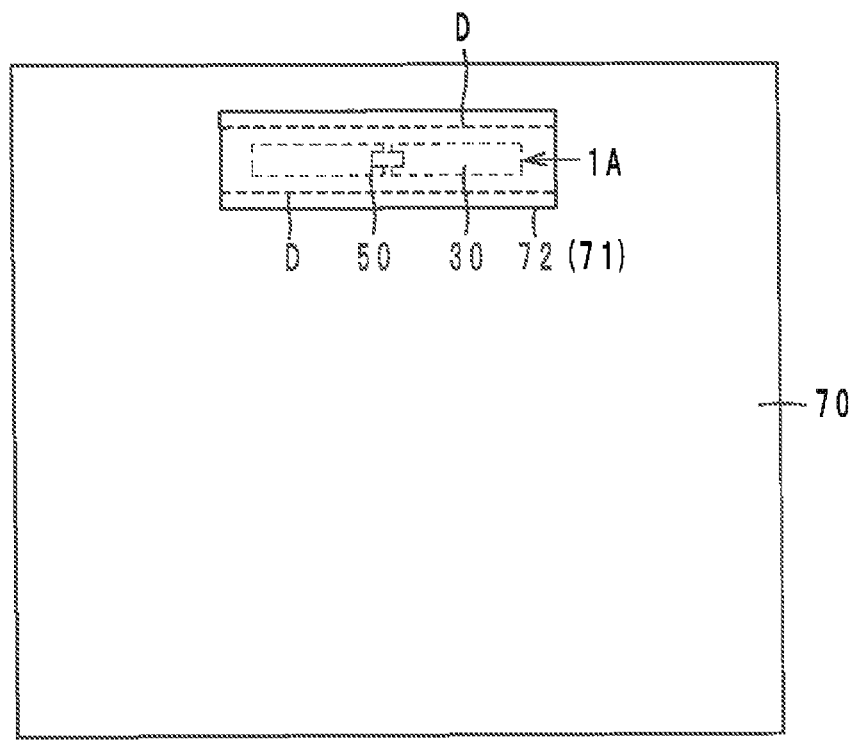
FIG. 9A is a plan view illustrating a state where the wireless IC device is attached to the piece of gauze.
Figure 9B:
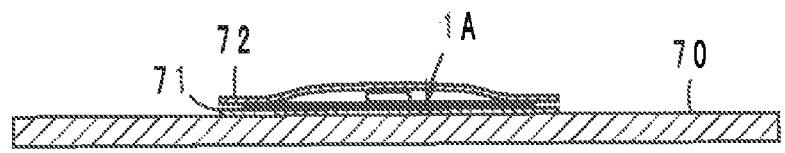
FIG. 9B is a sectional view illustrating the state where the wireless IC device is attached to the piece of gauze illustrated in FIG. 9A.

A process and configuration for attachment of the wireless IC device 1A to an item will now be described. Here, the item is specifically a piece of surgical gauze 70, for example. In other words, as illustrated in FIG. 8, FIG. 9A, and FIG. 9B, the wireless IC device 1A that is sandwiched between a piece of nonwoven fabric 71 and a piece of nonwoven fabric 72 is sewn at a particular position on the piece of surgical gauze 70. The position at which the wireless IC device 1A is to be sewn is represented by dashed lines D in FIG. 9A. Note that the position at which the wireless IC device 1A is to be sewn is not limited to this position. In addition, the wireless IC device 1A may be attached to the piece of surgical gauze 70 by performing thermal compression bonding on appropriate positions around the piece of nonwoven fabric 71 and the piece of nonwoven fabric 72. The wireless IC device 1A may be sandwiched between the piece of surgical gauze 70 and the piece of nonwoven fabric 72. In other words, the piece of nonwoven fabric 71 that is disposed between the wireless IC device 1A and the piece of surgical gauze 70 may be omitted.

Even if the piece of surgical gauze 70 is bent or the like, since the base material sheet 10 and the antenna element 30 have flexibility, the wireless IC element 50 will not be damaged. Since the wireless IC element 50 that has rigidity is covered with the piece of nonwoven fabric 72 that has flexibility, corners of the wireless IC element 50 are covered, and thus, the wireless IC element 50 does not get stuck in the human body. In addition, after multiple pieces of surgical gauze 70 are used in surgery, each of the wireless IC devices 1A is checked using a reader-writer, so that an accident such as leaving the piece of surgical gauze 70 in the body of a patient can be prevented from occurring.

Second Preferred Embodiment

Figure 10B:
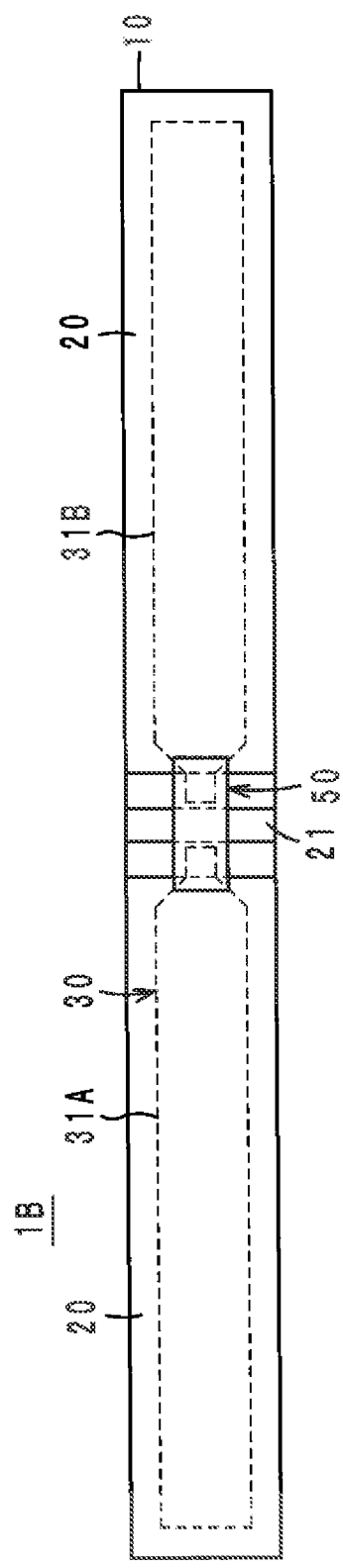
FIG. 10B is a plan view of the wireless IC device according to the second preferred embodiment with the wireless IC element mounted on the wireless IC device.
Figure 10C:
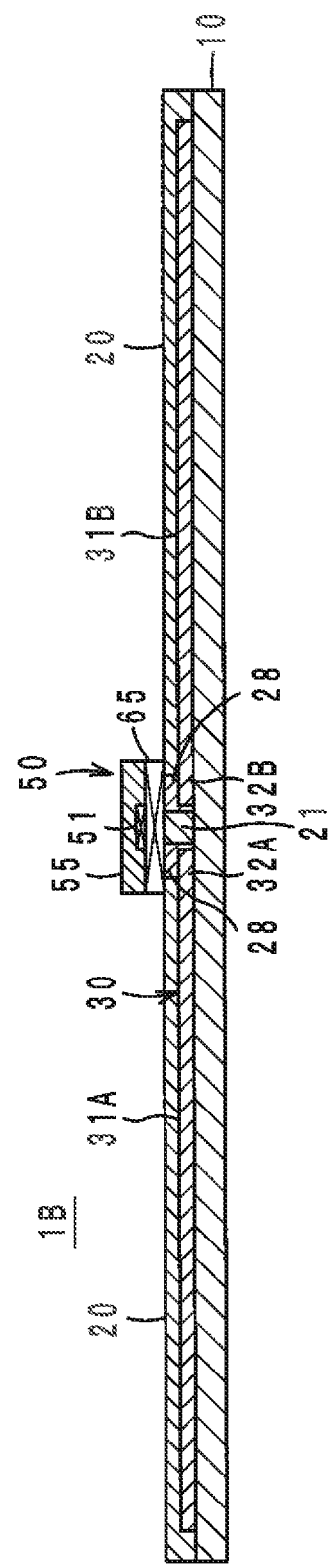
FIG. 10C is a sectional view of the wireless IC device illustrated in FIG. 10B in the long-side direction.
Figure 11:
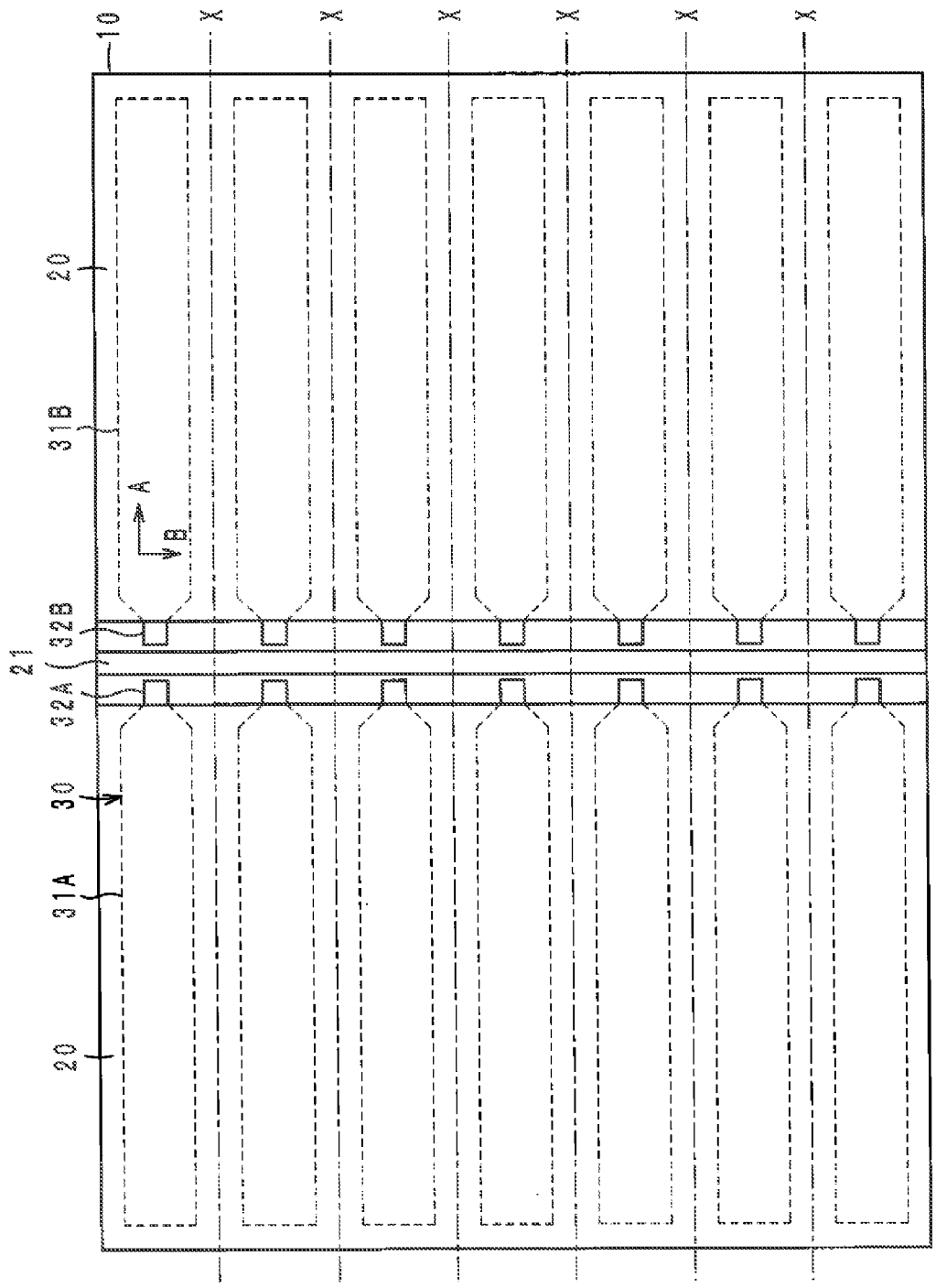
FIG. 11 is a plan view illustrating a state in the middle of a process of manufacturing the wireless IC device according to the second preferred embodiment of the present invention.
Figure 12A:
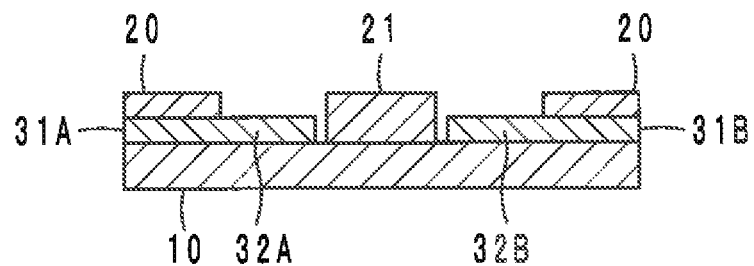
FIG. 12A is a first sectional view of a principal portion of the wireless IC device according to the second preferred embodiment of the present invention in the process of being manufactured.
Figure 12B:
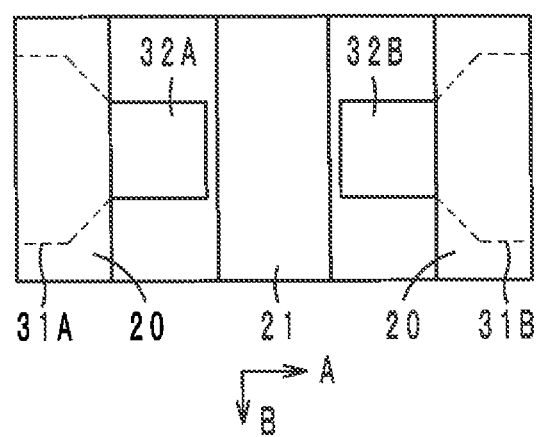
FIG. 12B is a first plan view of the principal portion of the wireless IC device illustrated in FIG. 12A.
Figure 12C:
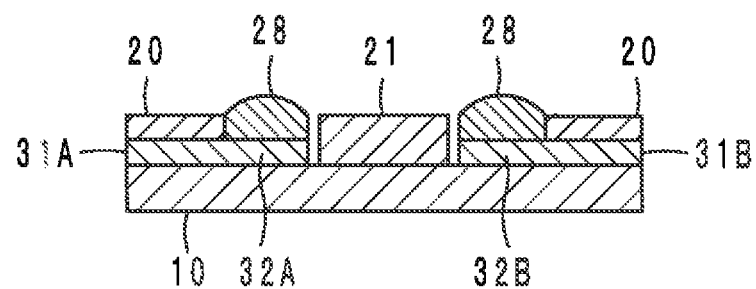
FIG. 12C is a second sectional view of the principal portion of the wireless IC device according to the second preferred embodiment of the present invention in the process of being manufactured.
Figure 12D:
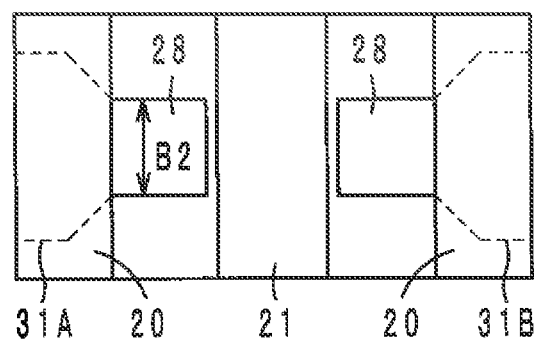
FIG. 12D is a second plan view of the principal portion of the wireless IC device illustrated in FIG. 12C.
Figure 13A:
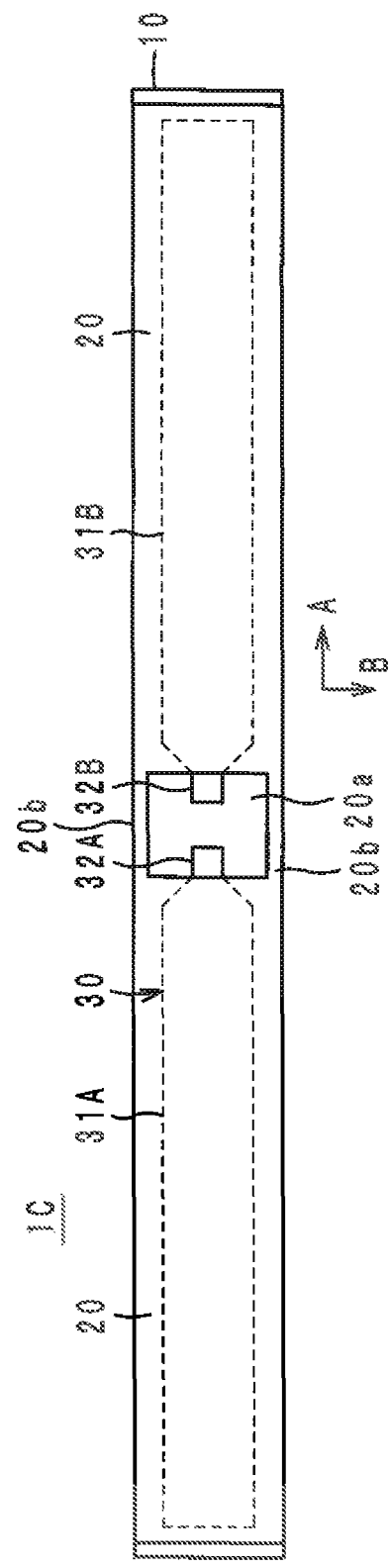
FIG. 13A is a plan view of a wireless IC device according to a third preferred embodiment of the present invention in a state before a wireless IC element is mounted on the wireless IC device.
Figure 13B:
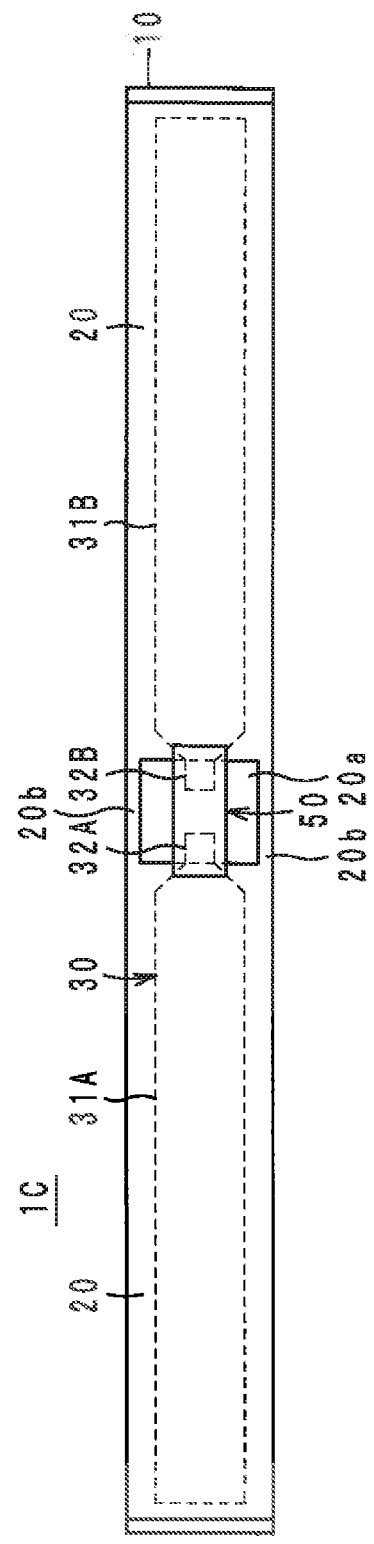
FIG. 13B is a plan view of the wireless IC device according to the third preferred embodiment of the present invention with the wireless IC element mounted on the wireless IC device.
Figure 13C:
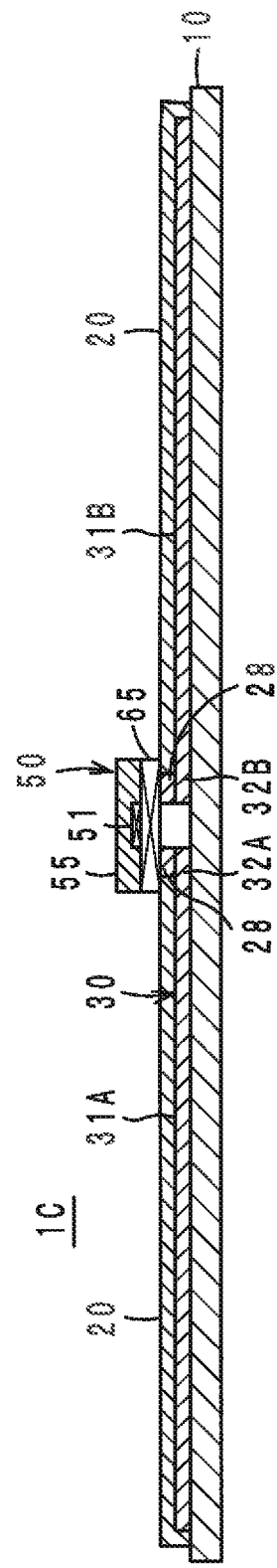
FIG. 13C is a sectional view of the wireless IC device illustrated in FIG. 13B in the long-side direction.
Figure 14:
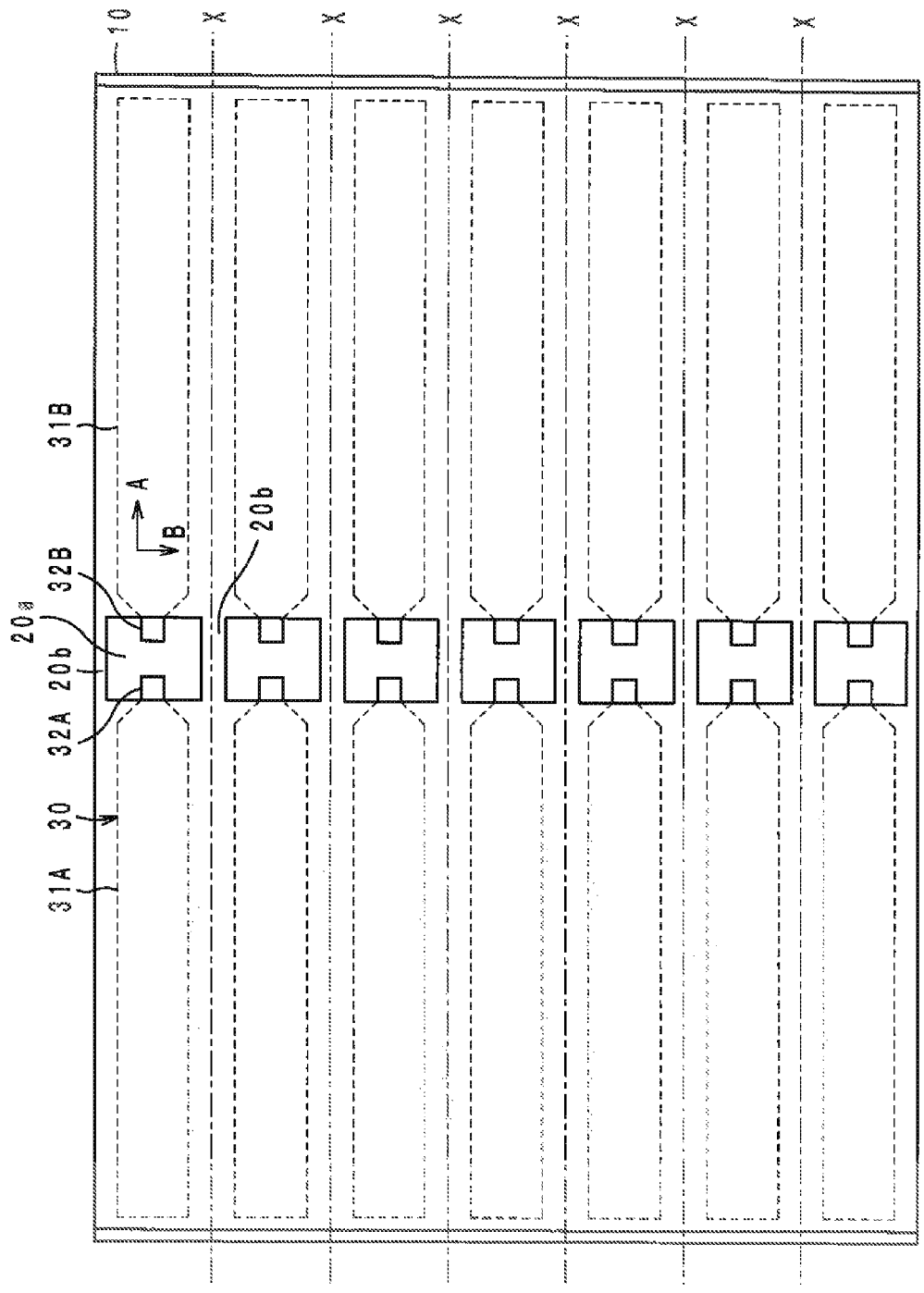
FIG. 14 is a plan view illustrating a state in the middle of a process of manufacturing the wireless IC device according to the third preferred embodiment of the present invention.

In a wireless IC device 1B according to a second preferred embodiment, as illustrated in FIGS. 10A to 10C, a resist layer 21 that is made of a material that is the same as the material from which a resist layer 20 is made is disposed between connection portions 32A and 32B so as to extend in a short-side direction B, and other configurations of the wireless IC device 1B preferably are similar to those of the first preferred embodiment. Therefore, the description of the second preferred embodiment is the same as that of the first preferred embodiment except with regard to the resist layer 21. In particular, in the wireless IC device 1B, a short circuit of solder 28 that is disposed on the connection portions 32A and 32B is prevented by the resist layer 21 disposed between the connection portions 32A and 32B.

Third Preferred Embodiment

In a wireless IC device 1C according to a third preferred embodiment, as illustrated in FIGS. 13A to 13C and FIG. 14, a portion of a resist layer 20 that does not cover two connection portions 32A and 32B is an opening 20a. In other words, a reinforcing member 20b extending in a long-side direction A is provided on each of end portions of a base material sheet 10 facing each other in a short-side direction B, and each of the reinforcing members 20b is made of a material the same as the material out of which the resist layer 20 is made and integrally formed with the resist layer 20. Other configurations of the wireless IC device 1C according to the third preferred embodiment are preferably similar to those of the first preferred embodiment. Therefore, the description of the third preferred embodiment is the same as that of the first preferred embodiment except with regard to the reinforcing members 20b. In particular, in the wireless IC device 1C, the strength of a center portion of the wireless IC device 1C on which the resist layer 20 is not formed is reinforced with the reinforcing members 20b.

Modification of First Preferred Embodiment

Figure 15A:
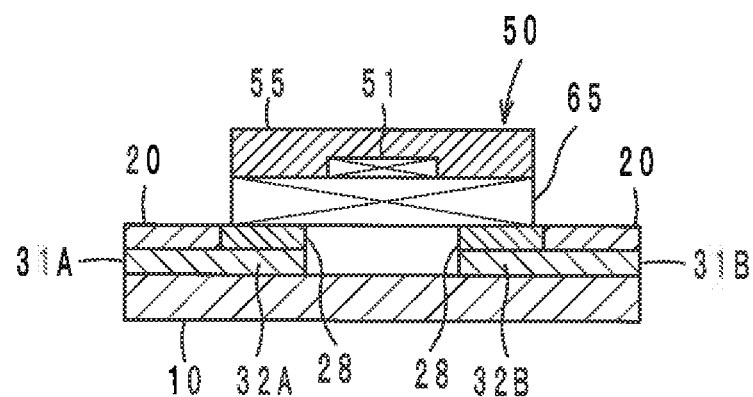
FIG. 15A is a sectional view illustrating a modification of the wireless IC device according to the first preferred embodiment of the present invention.
Figure 15B:
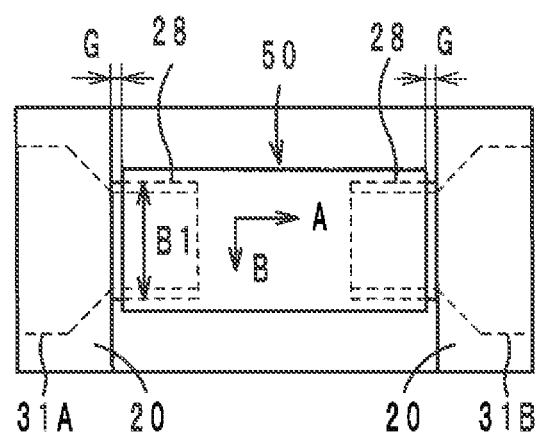
FIG. 15B is a plan view illustrating the modification of the wireless IC device illustrated in FIG. 15A.
Figure 16A:
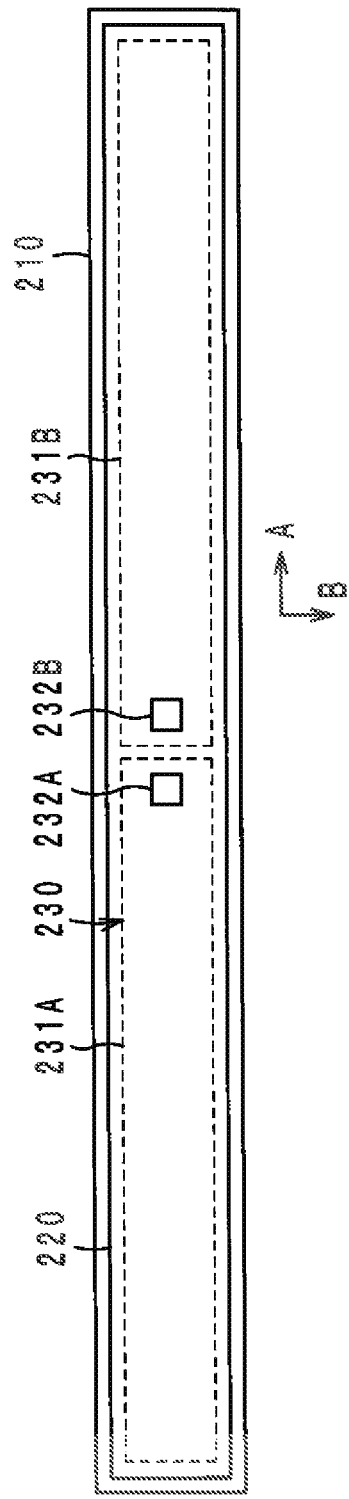
FIG. 16A is a plan view of a wireless IC device of the related art in a state before a wireless IC element is mounted on the wireless IC device.
Figure 16B:
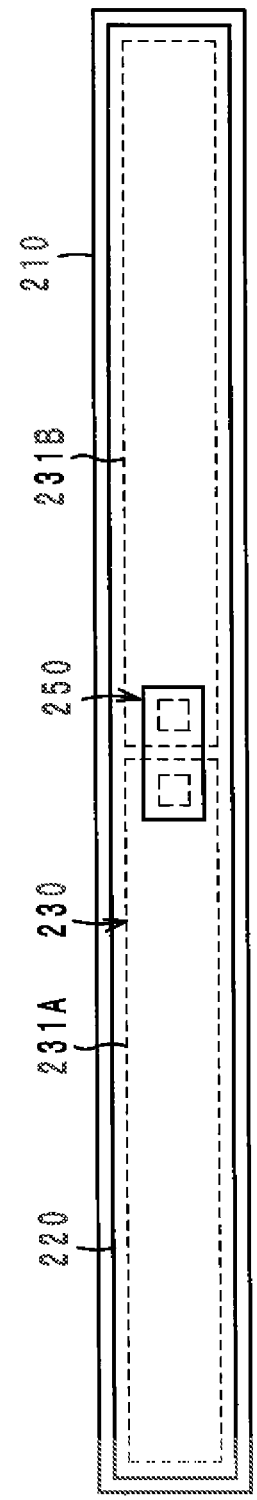
FIG. 16B is a plan view of the wireless IC device of the related art with the wireless IC element mounted on the wireless IC device.
Figure 16C:
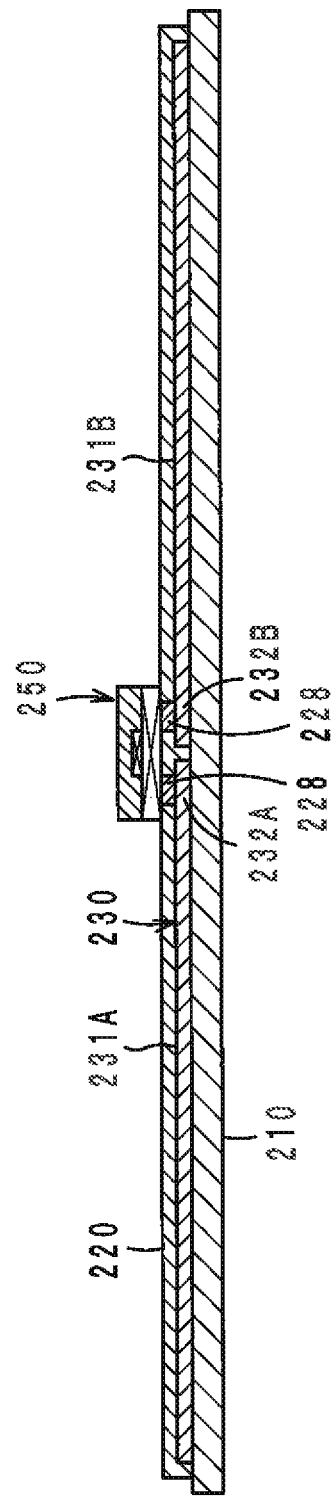
FIG. 16C is a sectional view of the wireless IC device illustrated in FIG. 16B in the long-side direction.
Figure 17A:
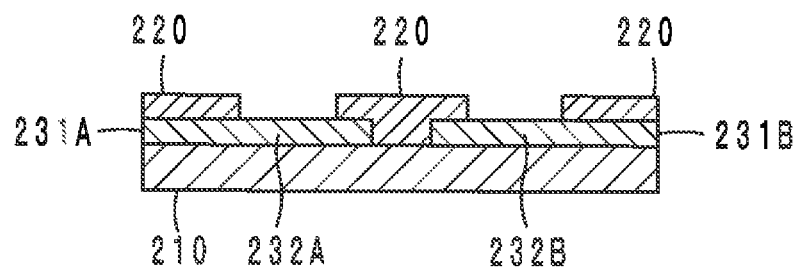
FIG. 17A is a first sectional view of a principal portion of the wireless IC device of the related art in the process of being manufactured.
Figure 17B:
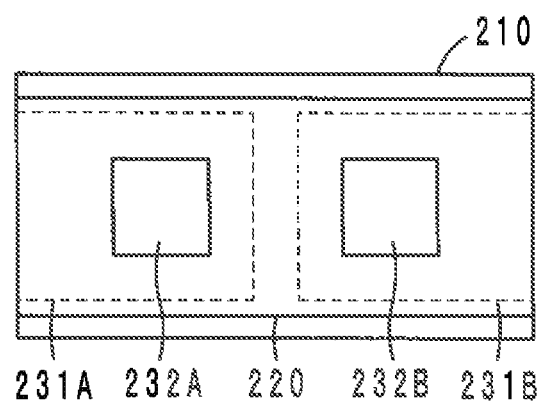
FIG. 17B is a first plan view of the principal portion of the wireless IC device illustrated in FIG. 17A.
Figure 17C:
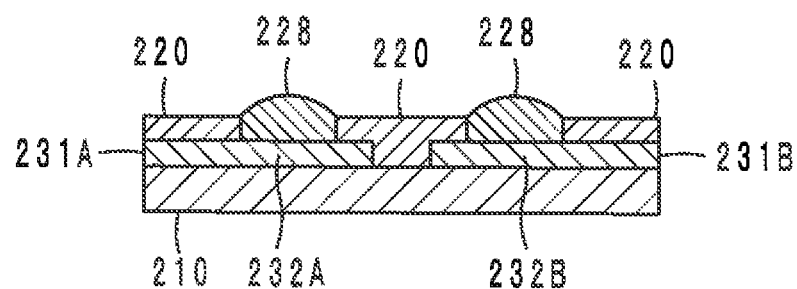
FIG. 17C is a second sectional view of the principal portion of the wireless IC device of the related art in the process of being manufactured.
Figure 17D:
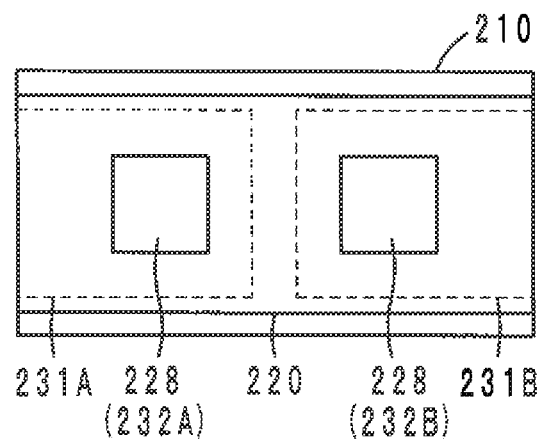
FIG. 17D is a second plan view of the principal portion of the wireless IC device illustrated in FIG. 17C.
Figure 17E:
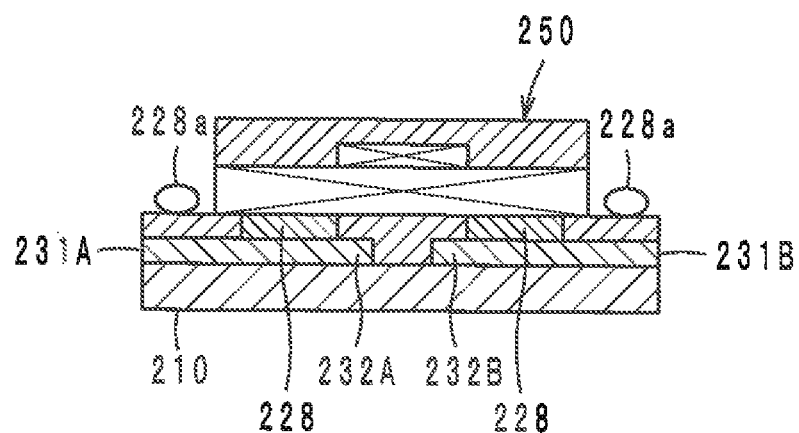
FIG. 17E is a third sectional view of the principal portion of the wireless IC device of the related art in the process of being manufactured.
Figure 17F:
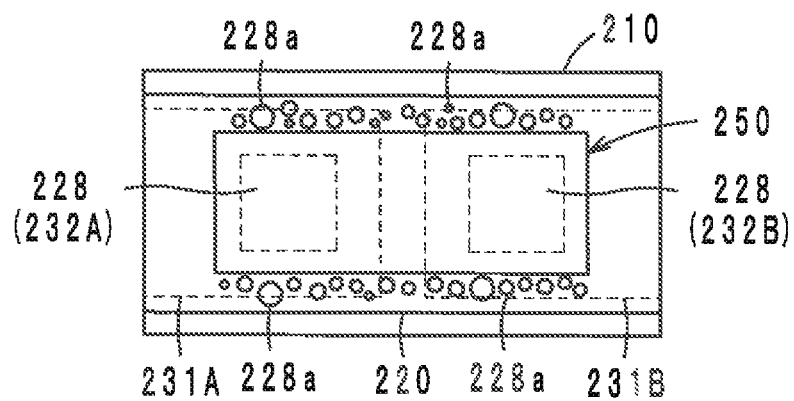
FIG. 17F is a third plan view of the principal portion of the wireless IC device illustrated in FIG. 17E.

A modification of the first preferred embodiment is illustrated in FIG. 15A and FIG. 15B. In the modification, the wireless IC element 50 is arranged such that each of the end portions of the wireless IC element 50 in the long-side direction A does not cover a corresponding one of an end portion of the radiation portion 31A and an end portion of the radiation portion 31B. In other words, a gap G is provided between each of the end portions of the wireless IC element 50 in the long-side direction A and the corresponding one of the end portion of the radiation part 31A and the end portion of the radiation part 31B. Other configurations and advantageous effects of the modification are preferably similar to those of the first preferred embodiment.

Other Modifications of Preferred Embodiments

Note that the wireless IC device and the method of manufacturing the wireless IC device according to the present invention are not limited to the preferred embodiments that have been described above, and various modifications can be made within the scope of the present invention.

In particular, the materials, shapes, and sizes of the base material sheet, the resist layer, and the antenna element may be suitably selected depending on applications. The shape of the antenna element is arbitrary, and the antenna element may be have a meandering shape or a loop shape. In addition, an item to which the wireless IC device is to be attached is not limited to the piece of surgical gauze that has been mentioned above and may be a clothing item or various fabric products or other objects or products.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A wireless IC device comprising:
   a base material sheet that has a substantially rectangular shape having a long-side direction and a short-side direction;
   an antenna element that is provided on a surface of the base material sheet and that has two radiation parts extending in the long side direction with a predetermined gap therebetween and two connection parts located in the gap through which the two radiation parts oppose each other;
   a wireless IC element that is connected to the two connection parts via a conductive bonding material; and
   a resist layer that regulates the movement of the conductive bonding material; wherein
   the resist layer covers the two radiation parts and does not cover the two connection parts and at least areas adjacent to the connection parts in the short-side direction; and
   wherein the resist layer is completely divided in the long-side direction so as to separately cover the two radiation parts and so as not to cover the two connection parts and entire areas extending from each of the two connection parts to side surfaces of the base material sheet in the short-side direction.

2. The wireless IC device according to claim 1, wherein a maximum length of the conductive bonding material in the short-side direction is larger than a width of each of the connection parts.

3. The wireless IC device according to claim 1, wherein the resist layer is disposed between the two connection parts in such a manner as to extend in the short-side direction.

4. The wireless IC device according to claim 1, wherein a reinforcing member extending along the long-side direction is disposed on each of end portions of the base material sheet facing each other in the short-side direction.

5. The wireless IC device according to claim 4, wherein each of the reinforcing members is made of a material the same as a material out of which the resist layer is made.

6. The wireless IC device according to claim 1, wherein the resist layer is provided on the base material sheet by screen printing.

7. The wireless IC device according to claim 1, wherein the resist layer is provided on the base material sheet by transferring a sheet member onto the base material sheet.

8. The wireless IC device according to claim 1, wherein the length of each of the radiation parts in the short-side direction is larger than the length of a corresponding one of the connection parts in the short-side direction.

9. The wireless IC device according to claim 1, wherein the base material sheet, the antenna element, and the resist layer have flexibility.

10. The wireless IC device according to claim 1, wherein the base material sheet is configured to be attached to an item having flexibility.

11. The wireless IC device according to claim 1, wherein the base material sheet is configured to be attached to a piece of medical gauze.

12. The wireless IC device according to claim 1, wherein the wireless IC element is a wireless IC chip that processes a predetermined radio signal.

13. The wireless IC device according to claim 1, wherein the wireless IC element includes a wireless IC chip that processes a predetermined radio signal and a power supply circuit board that includes a power supply circuit having a predetermined resonant frequency.

14. A method of manufacturing a wireless IC device comprising:
preparing a base material sheet that has a substantially rectangular shape having a long-side direction and a short-side direction;
forming on a surface of the base material sheet an antenna element that has two radiation parts extending in the long side direction with a predetermined gap therebetween and two connection parts formed in the gap through which the two radiation parts oppose each other;
arranging a resist layer in such a manner that the resist layer covers the two radiation parts and does not cover the two connection parts and at least areas adjacent to the connection parts in the short-side direction,
wherein the resist layer is completely divided in the long-side direction so as to separately cover the two radiation parts and so as not to cover the two connection parts and entire areas extending from each of the two connection parts to side surfaces of the base material sheet in the short-side direction;
disposing a conductive bonding material on the two connection parts after arranging the resist layer; and
connecting a wireless IC element to the conductive bonding material.

15. The method according to claim 14, further comprising a step of attaching the base material sheet to an item having flexibility.

16. The method according to claim 14, further comprising a step of attaching the base material sheet to a piece of medical gauze.

17. The method according to claim 14, wherein the wireless IC element is a wireless IC chip that processes a predetermined radio signal.

18. The method according to claim 14, wherein the wireless IC element includes a wireless IC chip that processes a predetermined radio signal and a power supply circuit board that includes a power supply circuit having a predetermined resonant frequency.

* * * * *